(12) United States Patent
Wang et al.

(10) Patent No.: US 12,439,752 B2
(45) Date of Patent: Oct. 7, 2025

(54) LIGHT EMITTING DIODE STRUCTURE

(71) Applicant: Lextar Electronics Corporation, Hsinchu (TW)

(72) Inventors: Hsin-Chuan Wang, Hsinchu (TW); Tzong-Liang Tsai, Hsinchu (TW); Hsiu-Mei Chou, Hsinchu (TW); Chin-Hung Luo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 798 days.

(21) Appl. No.: 17/655,174

(22) Filed: Mar. 17, 2022

(65) Prior Publication Data

US 2022/0310894 A1 Sep. 29, 2022

(30) Foreign Application Priority Data

Mar. 23, 2021 (CN) .......................... 202110307377.1

(51) Int. Cl.
*H10H 20/857* (2025.01)
*H10H 20/825* (2025.01)

(52) U.S. Cl.
CPC ........ *H10H 20/857* (2025.01); *H10H 20/825* (2025.01)

(58) Field of Classification Search
CPC ......... H01L 33/62; H01L 33/32; H01L 33/20; H01L 33/382; H01L 33/486;
(Continued)

(56) References Cited

U.S. PATENT DOCUMENTS 7,087,931 B2 8/2006 Wu et al.
7,791,101 B2 9/2010 Bergmann et al.
(Continued)

FOREIGN PATENT DOCUMENTS

CN 102447016 A * 5/2012
CN 105684167 A 6/2016
(Continued)

OTHER PUBLICATIONS

Machine Translation of CN 102447016 (Year: 2012).*

*Primary Examiner* — Julia Slutsker
(74) *Attorney, Agent, or Firm* — CKC & Partners Co., LLC

(57) ABSTRACT

The disclosure provides a light emitting diode structure, including a substrate, a first semiconductor layer, a light emitting layer, a second semiconductor layer, a semiconductor contacting layer, a first conductive layer and a second conductive layer. The first semiconductor layer is disposed on the substrate. The first semiconductor includes a first thickness structure and a second thickness structure, in which the first thickness structure is thicker than the second thickness structure. The light emitting layer is disposed on the first thickness structure. The second semiconductor layer is disposed on the light emitting layer The semiconductor contacting layer is disposed on the second thickness structure, in which the vertical projections of the semiconductor contacting layer and the light emitting layer on the substrate don't overlap nor contact. A doping type of the semiconductor contacting layer is the same as the first semiconductor layer.

20 Claims, 22 Drawing Sheets

(58) Field of Classification Search
CPC ....... H01L 33/387; H01L 33/02; H01L 33/44; H01L 21/02395; H01L 21/0243; H01L 21/02461
See application file for complete search history.

(56) References Cited

U.S. PATENT DOCUMENTS

| | | | |
|---|---|---|---|
| 8,330,168 | B2 | 12/2012 | Ohta et al. |
| 8,822,976 | B2 | 9/2014 | Inazu et al. |
| 2011/0266553 | A1* | 11/2011 | Ohta .................. H01L 33/32 438/46 |
| 2014/0327028 | A1* | 11/2014 | Matsumura ......... H01L 33/0066 257/98 |
| 2019/0081215 | A1 | 3/2019 | Inazu et al. |

FOREIGN PATENT DOCUMENTS

| | | | |
|---|---|---|---|
| CN | 108538976 | A | 9/2018 |
| JP | 2006066556 | A | 3/2006 |
| JP | 2006245162 | A | 9/2006 |
| JP | 4687374 | B2 | 5/2011 |
| JP | 5594530 | B2 | 9/2014 |
| TW | 201511042 | A | 3/2015 |

\* cited by examiner

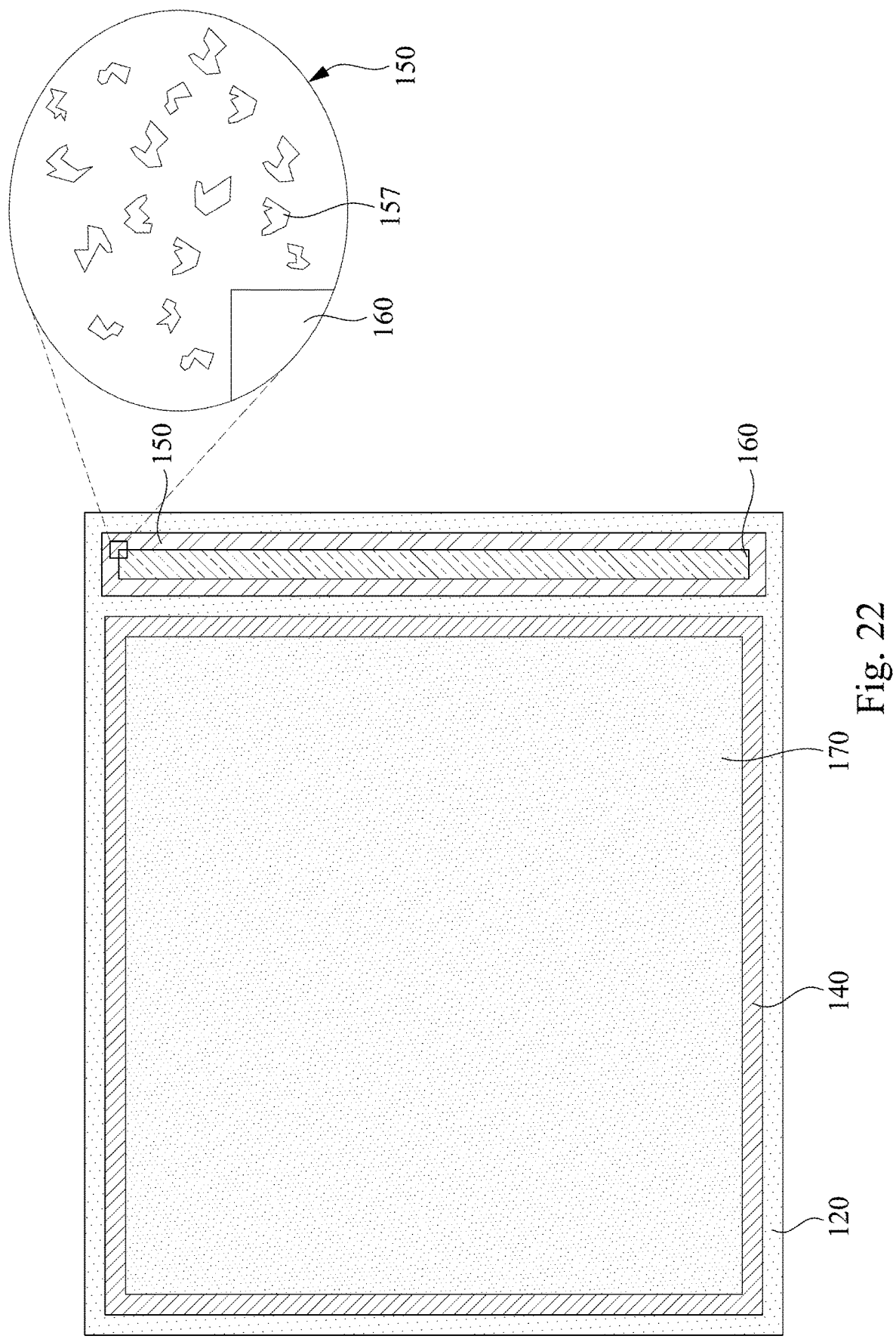

LIGHT EMITTING DIODE STRUCTURE

CROSS-REFERENCE TO RELATED APPLICATION

This application claims priority to China Application Serial Number 202110307377.1, filed on Mar. 23, 2021, which is herein incorporated by reference in its entirety.

BACKGROUND

Field of Invention

The present disclosure relates to a light emitting diode structure, especially relates to a light emitting diode structure that is able to reduce forward operating voltage and waste heat of elements.

Description of Related Art

Light Emitting Diode (LED) is a light-emitting element made of semiconductor materials, which can convert electric energy to light. It has the advantages of small size, high energy conversion efficiency, long life and power saving, and etc. Therefore, it is widely used as the light source of various electronic devices.

In the structural design of UV LEDs, in order to reduce the absorption effect of the semiconductor, it is common to use N-type gallium aluminum nitride as the N-type contacting layer. However, compared to N-type gallium nitride, which is commonly used in blue light, the contacting resistance of N-type gallium aluminum nitride is higher, which results in higher operating voltage of the element. The second problem is that when the composition of aluminum is higher than 20%, a higher alloy temperature is required, which reduces the reflectivity of N-type metal and is not conducive to the luminous efficiency of the elements.

In the prior art, to solve the above problems, an N-type contacting layer with lower aluminum content than the N-type layer is added between the N-type layer and the light emitting layer. However, when the aluminum content of N-type contacting layer approaches that of the N-type layer, the effect of improving operating voltage is not good. When the aluminum content of the N-type contacting layer is far less than that of the N-type layer or even approaches 0, the voltage can be improved, but the light absorption effect is likely to occur. Moreover, due to the larger lattice matching difference, the epitaxial quality formed on the N-type contacting layer will deteriorate, thus affecting the luminous efficiency.

Another way to reduce the contacting resistance of the N-type electrode is to increase the electron concentration of the N-type contacting layer by high doping. In practice, the method is to increase the silicon concentration to more than $1 \times 10^{19}/cm^3$. However, if the doping concentration is too high, the epitaxial quality wouldn't be good, and the crystal quality of the subsequent quantum well growth will also be affected.

In the above growth method, considering the tolerance of the etching process, the thickness of the N-type contacting layer should be at least greater than 0.5 μm, so that the epitaxial quality of the quantum well formed on the N-type contacting layer will deteriorate, and the luminous efficiency will be adversely affected. In view of this, there is a need to improve the existing technology.

SUMMARY

The purpose of the present disclosure is to provide a light emitting diode structure that is able to reduce forward operating voltage, waste heat of elements, and simultaneously increase output power and reliability.

In some embodiments of the present disclosure, the present disclosure provides a light emitting diode structure, including a substrate, a first semiconductor layer, at least one light emitting layer, at least one second semiconductor layer, at least one semiconductor contacting layer, at least one first conductive layer and at least one second conductive layer. The first semiconductor layer is disposed on the substrate, and has at least one first thickness structure and at least one second thickness structure. A first thickness of the at least one first thickness structure is substantially thicker than a second thickness of the at least one second thickness structure. The at least one light emitting layer is disposed on the at least one first thickness structure of the first semiconductor layer. The at least one second semiconductor layer is disposed on the at least one light emitting layer, in which a doping type of the at least one second semiconductor layer is different from a doping type of the first semiconductor layer. The at least one semiconductor contacting layer is disposed on the at least one second thickness structure of the first semiconductor layer, in which vertical projections of the semiconductor contacting layer and the light emitting layer on the substrate don't overlap nor contact, and a doping type of the at least one semiconductor contacting layer is the same as the doping type of the first semiconductor layer. The at least one first conductive layer is disposed on the at least one semiconductor contacting layer. The at least one second conductive layer is disposed on the at least one second semiconductor layer.

In some embodiments of the present disclosure, the light emitting diode structure further includes an insulating layer, at least one first conductive pad and at least one second conductive pad. The insulating layer at least covers a sidewall of the at least one first thickness structure, an upper surface of the at least one second thickness structure, a sidewall of the at least one light emitting layer, a sidewall of the at least one second semiconductor layer, a sidewall and an upper surface of the at least one semiconductor contacting layer, a sidewall of the at least one first conductive layer, and a sidewall and an upper surface of the at least one second conductive layer. The insulating layer has at least one first opening and at least one second opening, respectively disposed on the at least one first conductive layer and the at least one second conductive layer. The at least one first conductive pad and the at least one second conductive pad are both disposed on the insulating layer, and respectively electrically connected to the at least one first conductive layer and the at least one second conductive layer through the at least one first opening and the at least one second opening.

In some embodiments of the present disclosure, the at least one semiconductor contacting layer comprises $Al_xGa_yIn_{1-x-y}N$, and $0 \le x, y \le 1$.

In some embodiments of the present disclosure, when $x+y=1$, a doping concentration of the at least one semiconductor contacting layer is higher than $1 \times 10^{19}/cm^3$.

In some embodiments of the present disclosure, a thickness of the at least one semiconductor contacting layer is from 1 nm to 500 nm.

In some embodiments of the present disclosure, a doping concentration of the at least one semiconductor contacting layer is higher than a doping concentration of the first semiconductor layer.

In some embodiments of the present disclosure, the at least one semiconductor contacting layer includes multiple sub-contacting layers, a doping concentration of each of these sub-contacting layers is the same or different. Each of these sub-contacting layers is stacked in order according to the doping concentration or alternatively stacked in accordance with at least two doping concentrations.

In some embodiments of the present disclosure, the at least one semiconductor contacting layer includes multiple sub-contacting layers. These sub-contacting layers includes $Al_xGa_yIn_{1-x-y}N$, and $0≤x, y≤1$. When each of these sub-contacting layers has $x+y=1$, a doping concentration of the sub-contacting layer adjacent to the at least one first conductive layer is higher than doping concentrations of the other sub-contacting layers.

In some embodiments of the present disclosure, the at least one semiconductor contacting layer includes multiple sub-contacting layers. These sub-contacting layers includes $Al_xGa_yIn_{1-x-y}N$, and $0≤x, y≤1$. The sub-contacting layer adjacent to the at least one first conductive layer is $Ga_yIn_{1-y}N$, and $0<y<1$.

In some embodiments of the present disclosure, the at least one semiconductor contacting layer includes multiple sub-contacting layers, and each of these sub-contacting layers is stacked in order according to energy gaps or alternatively stacked in accordance with at least two energy gaps.

In some embodiments of the present disclosure, the at least one semiconductor contacting layer includes multiple independent contacting layers. These independent contacting layers are all electrically connected to the first semiconductor layer and the at least one first conductive layer. Any two adjacent independent contacting layers are separated from each other by an insulating part.

In some embodiments of the present disclosure, when an amount of the at least one semiconductor contacting layer is plurality, a part of the light emitting layer is disposed between any two semiconductor contacting layers. When an amount of the at least one first conductive layer is plurality, these first conductive layers are respectively disposed on these semiconductor contacting layers.

In some embodiments of the present disclosure, the light emitting diode structure further includes a conductive connecting layer, disposed on these first conductive layers, and configured to electrically connecting to each of these first conductive layers.

In some embodiments of the present disclosure, the at least one semiconductor contacting layer includes multiple through holes, these through holes penetrate the at least one semiconductor contacting layer along a thickness direction.

In some embodiments of the present disclosure, the present disclosure provides a light emitting diode structure, including a substrate, a second conductive layer, a second semiconductor layer, a light emitting layer, a first semiconductor layer, a first conductive layer, an insulating layer and a semiconductor contacting layer. The second conductive layer is disposed on the substrate. The second semiconductor layer is disposed on the second conductive layer. The light emitting layer is disposed on the second semiconductor layer. The first semiconductor layer is disposed on the light emitting layer, in which a doping type of the first semiconductor layer is different from a doping type of the second semiconductor layer. The first conductive layer is disposed between the substrate and the second conductive layer. The first conductive layer includes a base part and a protruding part, and the protruding part penetrates the second conductive layer, the second semiconductor layer and the light emitting layer to electrically connect with the first semiconductor layer. The insulating layer is disposed between the first conductive layer and the second conductive layer. The semiconductor contacting layer is disposed between the protruding part of the first conductive layer and the first semiconductor layer. A doping type of the semiconductor contacting layer is the same as a doping type of the first semiconductor layer. The protruding part of the first conductive layer and the semiconductor contacting layer are both electrically isolated from the second conductive layer, the second semiconductor layer and the light emitting layer by an extending part of the insulating layer.

In some embodiments of the present disclosure, a doping concentration of the semiconductor contacting layer is higher than a doping concentration of the first semiconductor layer.

In some embodiments of the present disclosure, the semiconductor contacting layer includes multiple sub-contacting layers, a doping concentration of each of these sub-contacting layers is the same or different. Each of these sub-contacting layers is stacked in order according to the doping concentration or alternatively stacked in accordance with at least two doping concentrations.

In some embodiments of the present disclosure, the semiconductor contacting layer includes multiple independent contacting layers. These independent contacting layers are all electrically connected to the first semiconductor layer and the at least one first conductive layer. Any two adjacent independent contacting layers are separated from each other by an insulating part.

In some embodiments of the present disclosure, the semiconductor contacting layer includes multiple through holes, these through holes penetrate the at least one semiconductor contacting layer along a thickness direction.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows. It should be understood that, according to industry practice, the various features are not drawn to scale. In fact, for the sake of clarity, the size of the various features can be arbitrarily increased or decreased.

FIG. 22 is a schematic diagram of the light emitting diode structure according to yet other embodiments of the present disclosure.

DETAILED DESCRIPTION

Figure 1:
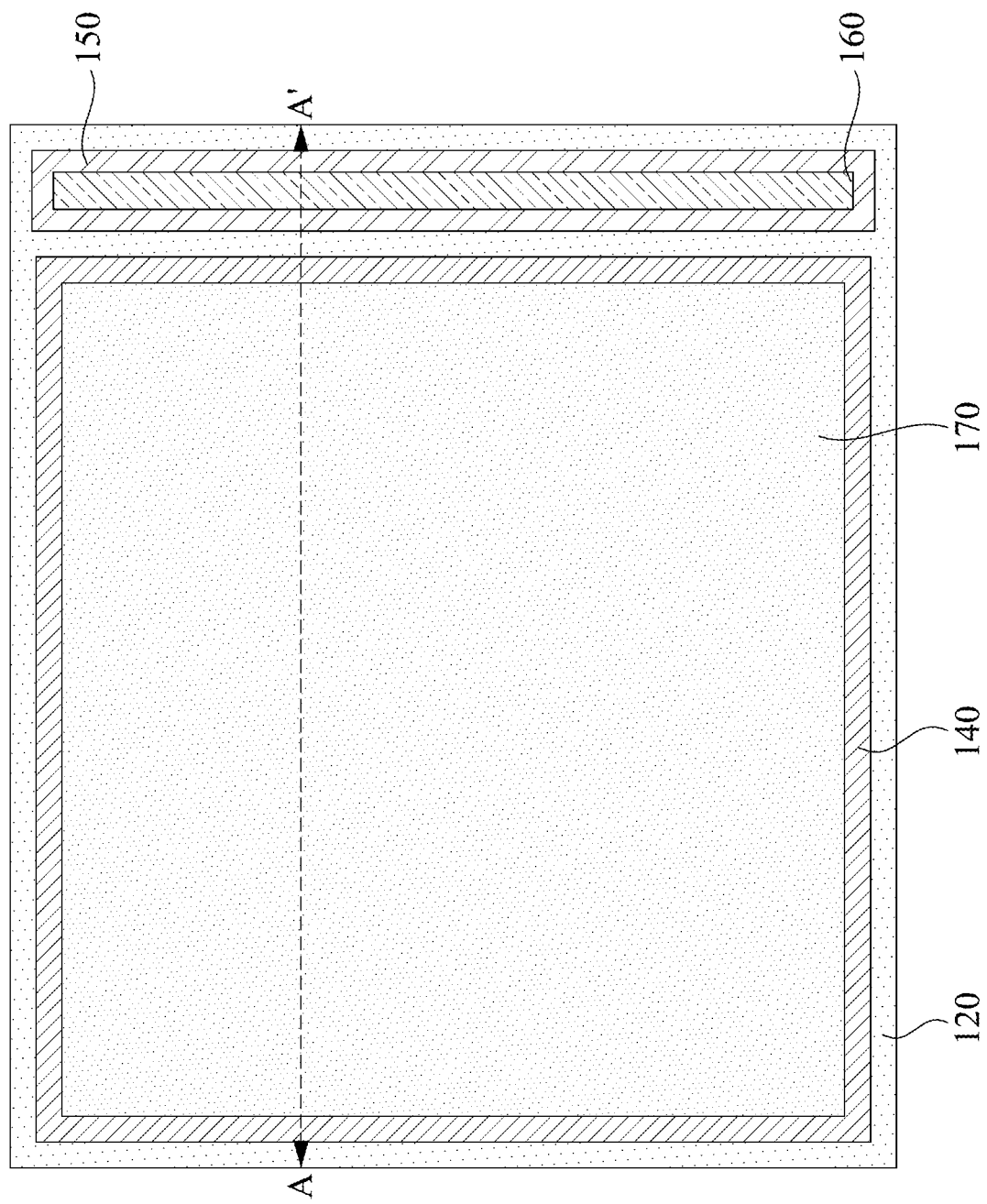
FIG. 1 is a top view of a light emitting diode structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, the light emitting structure of the present disclosure could be used in any associated device that has a lighting or luminous function. In the present disclosure, a thin semiconductor contacting layer (or ohmic contacting layer) is grown on the N-type semiconductor to make the N-type electrode form ohmic contacting. As such, it's possible for us to achieve the effect of reducing forward operating voltage, alloy temperature and waste heat of elements, and improve the output power and reliability of components.

Example 1

Figure 2:
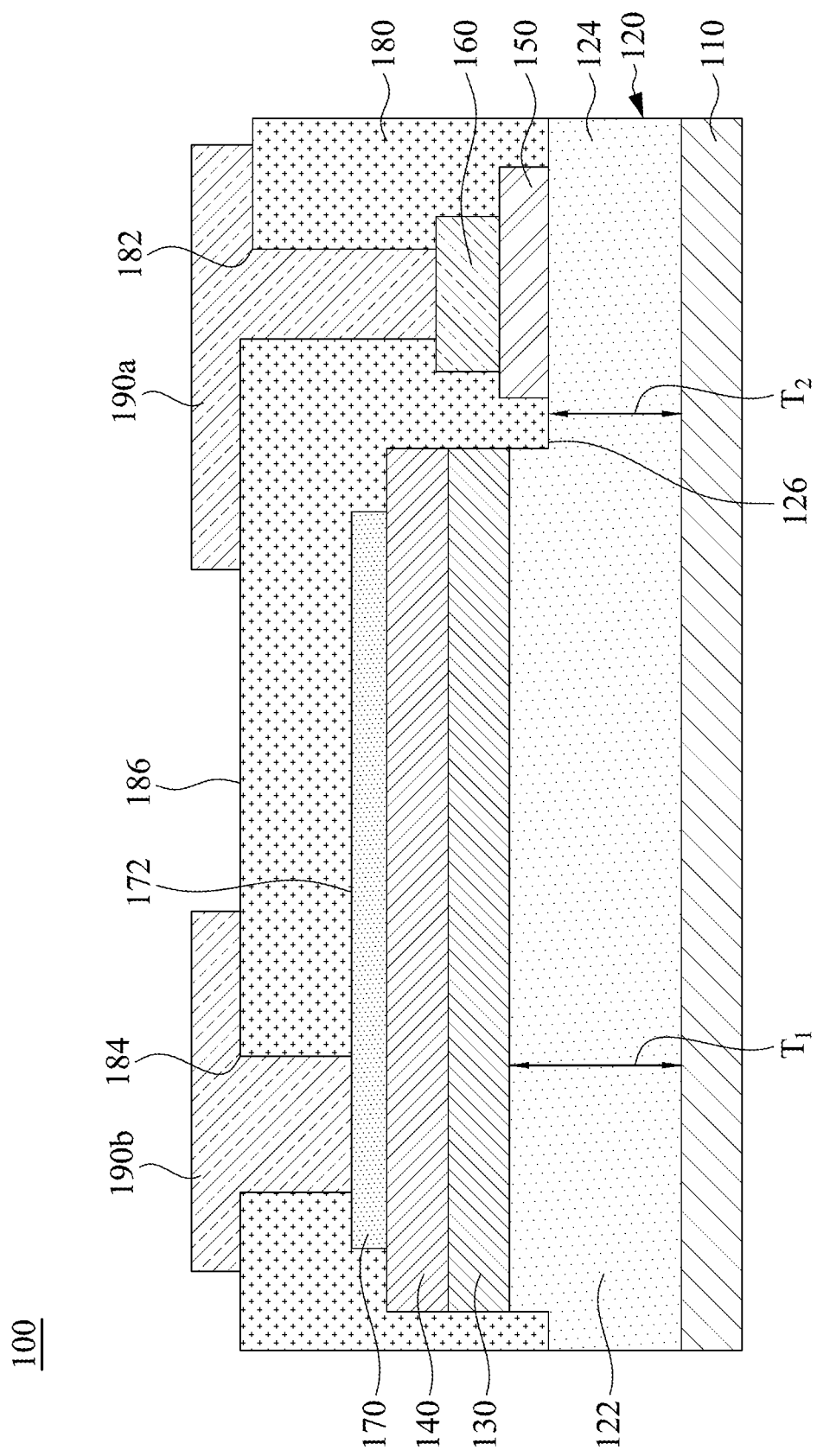
FIG. 2 is a cross-sectional view of the light emitting diode structure according to the section line AA' in FIG. 1.

In some embodiments of the present disclosure, the present disclosure provides a light emitting diode structure 100 that is able to reduce forward operating voltage. Please refer to FIG. 1 and FIG. 2 simultaneously. FIG. 1 is a top view of a light emitting diode structure according to some embodiments of the present disclosure. FIG. 2 is a cross-sectional view of the light emitting diode structure according to the section line AA' in FIG. 1. It should be noted that, for reference purpose, an insulating layer 180, a first conductive pad 190a and a second conductive pad 190b are not depicted in FIG. 1. The light emitting diode structure 100 includes a substrate 110, a first semiconductor layer 120, a light emitting layer 130, a second semiconductor layer 140, a semiconductor contacting layer 150, a first conductive layer 160, a second conductive layer 170, an insulating layer 180, a first conductive pad 190a and a second conductive pad 190b.

In some embodiments of the present disclosure, as shown in FIG. 2, the first semiconductor layer 120 is disposed on the substrate 110. The first semiconductor layer 120 has a first thickness structure 122 and a second thickness structure 124. A first thickness T1 of the first thickness structure 122 is substantially thicker than a second thickness T2 of the second thickness structure 124. The substrate 110 could include any suitable substrate. In one embodiment, the substrate 110 could be transparent substrate or opaque substrate. In some examples, materials of the substrate 110 includes, but not limited to, glass substrate, sapphire substrate, silicon substrate, printed circuit board, metal substrate, ceramic substrate, acrylic substrate, or a combination thereof. In one example, materials of the substrate 110 include, but not limited to, silicon dioxide ($SiO_2$), silicon nitride ($Si_3N_4$), titanium dioxide ($TiO_2$), tantalum pentoxide ($Ta_2O_5$), gold, aluminum, copper, nickel, or a combination thereof.

In one embodiment, the first semiconductor layer 120 could be N-type III-V group semiconductor layer. In some examples of the present disclosure, the III-V group semiconductor layer may include, but not limited to, binary epitaxial materials such as GaAs, GaN, GaP, InAs, and etc.; or, ternary or quaternary epitaxial materials such as GaAsP, AlGaAs, InGaP, InGaN, AlGaN, AlGaInN, AlInGaP, and InGaAsP. Therefore, the N-type III-V group semiconductor layer can be formed by doping the aforementioned III-V group semiconductor layer with IV-A group elements (such as silicon) or VI-A group elements (such as tellurium).

Please keep referring to FIG. 2, in some embodiments, the light emitting layer 130 is disposed on the first thickness structure 122 of the first semiconductor layer 120. In one embodiment, the light emitting layer 130 could include, but not limited to, multiple quantum well (MQW), single-quantum well (SQW), homojunction, heterojunction, or other similar structures.

Still referring to FIG. 2, in some embodiments, the second semiconductor layer 140 is disposed on the light emitting layer 130. In one embodiment, the second semiconductor layer 140 could be a P-type III-V group semiconductor layer. In some examples of the present disclosure, the III-V group semiconductor layer could include, but not limited to, binary epitaxial materials such as gallium arsenide, gallium nitride, gallium phosphide, indium arsenic, aluminum nitride, indium nitride, indium phosphide; or, ternary or quaternary epitaxial materials such as gallium arsenide phosphide, aluminum gallium arsenide, indium gallium phosphide, indium gallium nitride, aluminum gallium nitride, indium gallium aluminum nitride, aluminum indium gallium phosphide, indium gallium arsenide phosphor. Therefore, the P-type III-V semiconductor layer could be formed by doping the aforementioned III-V semiconductor layer with II-A group elements (such as beryllium, magnesium, calcium or strontium) or II-B group elements (such as zinc). Therefore, the doping type of the second semiconductor layer 140 is different from that of the first semiconductor layer 120.

As shown in FIG. 2, in some embodiments, the semiconductor contacting layer 150 is disposed on the second thickness structure 124 of the first semiconductor layer 120. And, the doping type of the semiconductor contacting layer 150 is the same as that of the first semiconductor layer 120. By disposing the semiconductor contacting layer 150, the resistance between the first semiconductor layer 120 and the first conductive layer 160 could be reduced.

In one embodiment, the semiconductor contacting layer 150 includes $Al_xGa_yIn_{1-x-y}N$, and $0 \le x$, $y \le 1$. Specifically, the semiconductor contacting layer 150 could be an N-type III-V group semiconductor layer. In some examples of the present disclosure, the III-V group semiconductor layer may include, but not limited to, binary epitaxial materials such as gallium nitride; or, ternary or quaternary epitaxial materials such as indium gallium nitride and indium aluminum gallium nitride. Therefore, the N-type III-V semiconductor layer could be formed by doping the aforementioned III-V semiconductor layer with IV-A group elements (such as silicon, etc.) or VI-A group elements. It should be mentioned that, in some examples, the vertical projections of the semiconductor contacting layer 150 and the light emitting layer 130 on the substrate 110 do not overlap nor contact. And, the vertical projections of the semiconductor contacting layer 150 and the first thickness structure 122 of the first semiconductor layer 120 on the substrate 110 do not overlap nor contact. In one embodiment, the thickness of the semiconductor contacting layer 150 is from about 1 nm to about 500 nm, including but not limited to, 1 nm, 20 nm, 40 nm, 60 nm, 80 nm, 100 nm, 120 nm, 140 nm, 160 nm, 180 nm, 200 nm, 220 nm, 240 nm, 260 nm, 280 nm, 300 nm, 320 nm, 340 nm, 360 nm, 380 nm, 400 nm, 420 nm, 440 nm, 460 nm, 480 nm, 500 nm or any value in between two of these values.

In some embodiments, the first conductive layer 160 is disposed on the semiconductor contacting layer 150. In one embodiment of the present disclosure, the doping concentration of the semiconductor contacting layer 150 is higher than that of the first semiconductor layer 120. In another embodiment of the present disclosure, the semiconductor contacting layer 150 includes $Al_xGa_yIn_{1-x-y}N$, where $x+y=1$, and the doping concentration of the semiconductor contacting layer 150 is higher than $1 \times 10^{19}/cm^3$. As for the doping concentration of the aforementioned semiconductor contacting layer 150, it is because when the doping concentration of the semiconductor contacting layer 150 is higher than $1 \times 10^{19}/cm^3$, the semiconductor contacting layer 150 will enter a degenerate state. At this point, the impurity energy levels form a continuous energy band, resulting in the reduction of the equal energy gap of the semiconductor contacting layer 150. As such, carrier transmission between the first semiconductor layer 120 and the semiconductor contacting layer 150 and between the first conductive layer 160 and the semiconductor contacting layer 150 is much easier (because the energy gap that carriers need to cross is reduced), and the contacting resistance is therefore reduced. In another embodiment of the present disclosure, the semiconductor contacting layer 150 includes $Al_xGa_yIn_{1-x-y}N$, where $x=0$. That is, the semiconductor contacting layer 150 includes $Ga_yIn_{1-y}N$. In this case, the energy gap of the semiconductor contacting layer 150 is relatively low, which reduces the energy gap that carriers need to cross between the first semiconductor layer 120 and the first conductive layer 160. Thus, the contacting resistance is reduced.

In some embodiments, the width of the first conductive layer 160 disposed on the semiconductor contacting layer 150 is substantially less than that of the semiconductor contacting layer 150. The materials of the first conductive layer 160 include, but not limited to, transparent conductive materials including indium tin oxide (ITO), indium zinc oxide (IZO), aluminum zinc oxide (AZO), or materials with transparent and conductive effect; or a metal material that is opaque to light. For example, the opaque metal materials include chromium (Cr), gold (Au), titanium (Ti), aluminum (Al), vanadium (V) or a similar opaque metal material.

In some embodiments, the second conductive layer 170 is disposed on the second semiconductor layer 140, and the width of the second conductive layer 170 is substantially less than that of the second semiconductor layer 140. In one embodiment, the material of the second conductive layer 170 includes, but not limited to, the transparent conductive materials including indium tin oxide, indium zinc oxide, aluminum zinc oxide, or materials with transparent and conductive effect; or a metal material that is opaque to light, such as gold, titanium, aluminum, nickel (Ni), platinum (Pt), palladium (Pd), or a similar opaque metal material.

Still referring to FIG. 2, in one embodiment, the insulating layer 180 is disposed on the aforementioned light emitting diode structure. The insulating layer 180 at least covers a sidewall of the first thickness structure 122, an upper surface 126 of the second thickness structure 124, a sidewall of the light emitting layer 130, a sidewall of the second semiconductor layer 140, a sidewall and an upper surface of the semiconductor contacting layer 150, a sidewall of the first conductive layer 160, and a sidewall and an upper surface 172 of the second conductive layer 170. In other embodiments, the insulating layer 180 can also be without covering the upper surface of the first conductive layer 160, that is, the insulating layer 180 only covers the two side walls of the first conductive layer 160. In addition, the insulating layer 180 has a first opening 182 and a second opening 184 which are located on the first conductive layer 160 and the second conductive layer 170 respectively. In some examples of the present disclosure, the insulating layer 180 could be formed by chemical vapor deposition, printing, coating, or other appropriate methods. And, the first opening 182 and the second opening 184 could be formed by an etching process. In some examples, the materials used for insulating layer 180 could include, but not limited to, silicon oxide, silicon nitride, silicon oxynitride, epoxy resin or other suitable insulating material.

In one embodiment of the present disclosure, when the insulating layer 180 covers the side wall and the upper surface of the first conductive layer 160, the width of the first conductive layer 160 is substantially greater than the width of the first opening 182 of the insulating layer 180. In another embodiment, when the insulating layer 180 only covers the two side walls of the first conductive layer 160, the width of the first conductive layer 160 is substantially equal to the width of the first opening 182 of the insulating layer 180.

In one embodiment, the first conductive pad 190a is disposed on the insulating layer 180, and is electrically connected to the first conductive layer 160 by the first opening 182. The second conductive pad 190b is disposed on the insulating layer 180, and is electrically connected to the second conductive layer 170 by the second opening 184. Specifically, the first conductive pad 190a is disposed on the insulating layer 180, and the first opening 182 is filled by the first conductive pad 190a. The second conductive pad 190b is disposed on the insulating layer 180, and the second opening 184 is filled by the second conductive pad 190*b*. In some examples, the first conductive pad 190*a* and the second conductive pad 190*b* protrude and are exposed on the top surface of the insulating layer 180. The exposed portion could be used as a carrier for electrical contact. In some examples, the materials for the first conductive pad 190*a* and the second conductive pad 190*b* include, but not limited to, aluminum, copper, nickel, gold, platinum, titanium, or other suitable conductive material.

Please refer to FIG. 3 to FIG. 8, FIG. 3 to FIG. 8 are cross-sectional views of the light emitting diode structure in each step of the manufacturing process according to some embodiments of the present disclosure. The manufacturing process of the light emitting diode structure of the present disclosure is described below. In order to facilitate the comparison of the differences of the above embodiments and to simplify the description, the same symbols are used to mark the same elements in the following embodiments, and the differences between the embodiments are mainly described without repetition.

Figure 3:
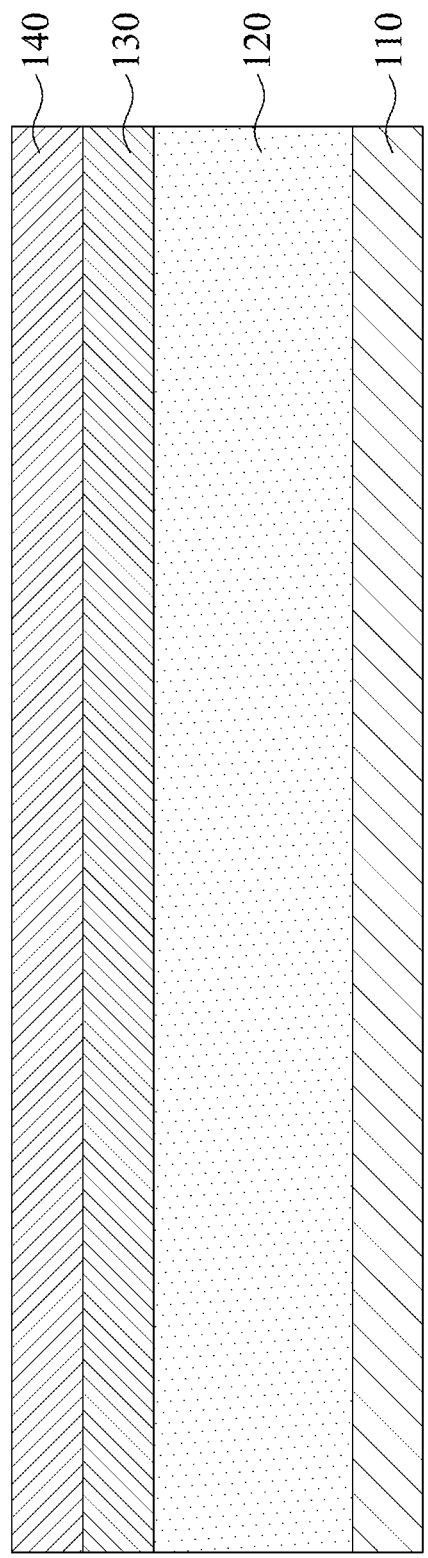
FIG. 3 to FIG. 8 are cross-sectional views of the light emitting diode structure in each step of the manufacturing process according to some embodiments of the present disclosure.

Firstly, as shown in FIG. 3, in an embodiment, the substrate 110 acts as the growth substrate for epitaxial growth. Next, the first semiconductor layer 120, the light emitting layer 130 and the second semiconductor layer 140 are deposited or stacked from bottom to top. In some examples, the first semiconductor layer 120 is an N-type III-V group semiconductor layer, and the second semiconductor layer 140 is a P-type III-V group semiconductor layer. The formation or deposition methods of the aforementioned first semiconductor layer 120, light emitting layer 130 and second semiconductor layer 140 could include, but not limited to, chemical vapor deposition (CVD), physical vapor deposition, plasma enhanced chemical vapor deposition (PECVD), atomic layer deposition, electroplating, or other appropriate process and/or a combination thereof. In some examples, the side walls of the substrate 110, the first semiconductor layer 120, the light emitting layer 130, and the second semiconductor layer 140 are aligned with each other. The materials or compositions of the substrate 110, the first semiconductor layer 120, the light emitting layer 130 and the second semiconductor layer 140 have been described in the previous paragraphs and will not be repeated here.

Figure 4:
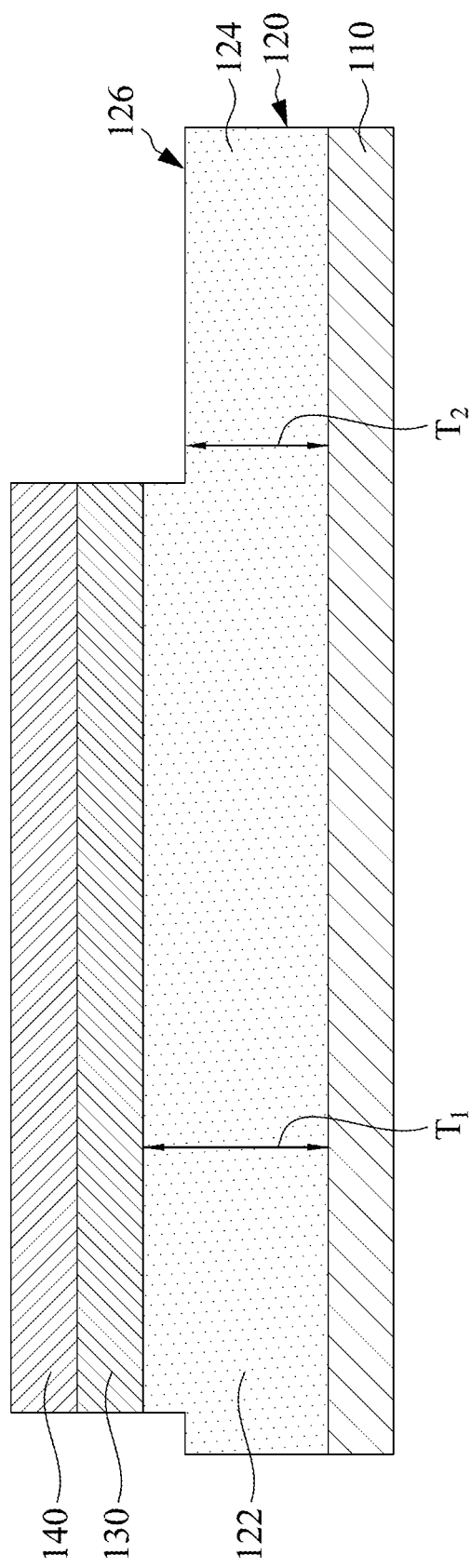

Then, as shown in FIG. 4, in an embodiment, FIG. 4 includes the steps of etching part of the aforementioned second semiconductor layer 140, part of the light emitting layer 130 and part of the first semiconductor layer 120, and exposing part of the first semiconductor layer 120. In this step, a mask or anti-etching material (not shown) is firstly disposed on the upper surface of part of the second semiconductor layer 140. Then, the second semiconductor layer 140 is etched downward until part of the first semiconductor layer 120 is also etched. Then, the mask or anti-etching material is removed. Thus, the first thickness structure 122 and the second thickness structure 124 of the first semiconductor layer 120 will be formed. In one embodiment, the first thickness structure 122 has a first thickness T1, and the second thickness structure 124 has a second thickness T2. Moreover, after the first semiconductor layer 120 is etched, the exposed part is the second thickness structure 124. Therefore, the first thickness T1 mentioned above is substantially greater than the second thickness T2. In this step, the etching process includes that can be applied to large depths etching process. In some examples, the etching process includes, but not limited to, dry etching (e.g., plasma etching), wet etching (e.g., chemical etching), or other suitable process and/or a combination thereof to etch. In one example, the present disclosure uses plasma etching to expose the upper surface 126 of the second thickness structure 124 of the first semiconductor layer 120.

Figure 5:
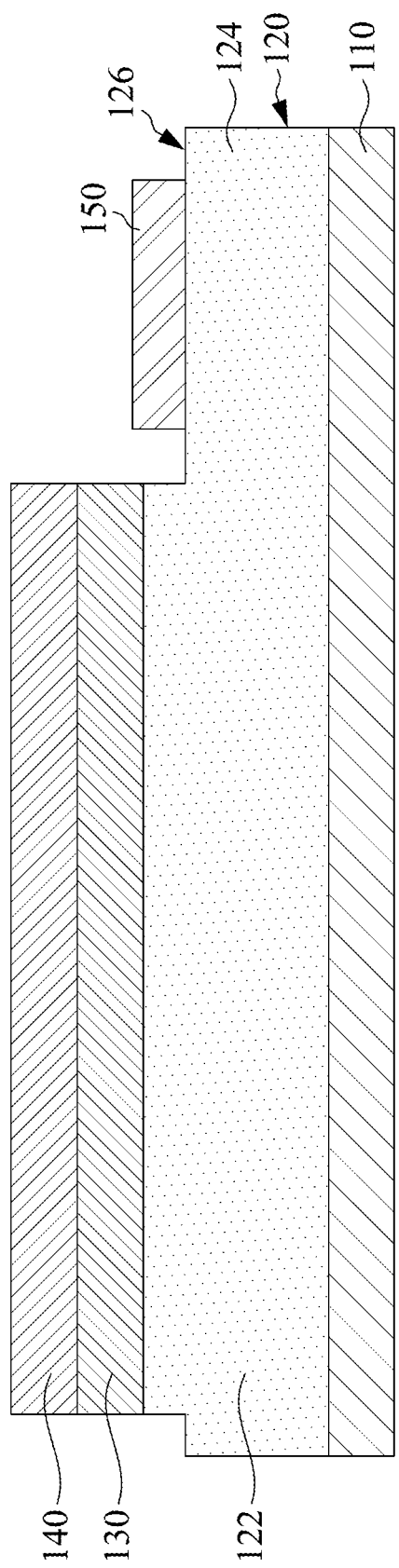

As shown in FIG. 5, in some embodiments, the semiconductor contacting layer 150 is formed on the second thickness structure 124. In one embodiment, the width of the semiconductor contacting layer 150 is substantially less than that of the second thickness structure 124. That is, a portion of the upper surface 126 of the second thickness structure 124 is still exposed after the formation of the semiconductor contacting layer 150. In one embodiment, the formation or deposition methods of the semiconductor contacting layer 150 could include, but not limited to, chemical vapor deposition, physical vapor deposition, plasma enhanced chemical vapor deposition, atomic layer deposition, electroplating, or other appropriate process and/or a combination thereof. The material or composition of the semiconductor contacting layer 150 has been described in detail in the previous paragraph and will not be repeated here.

Figure 6:
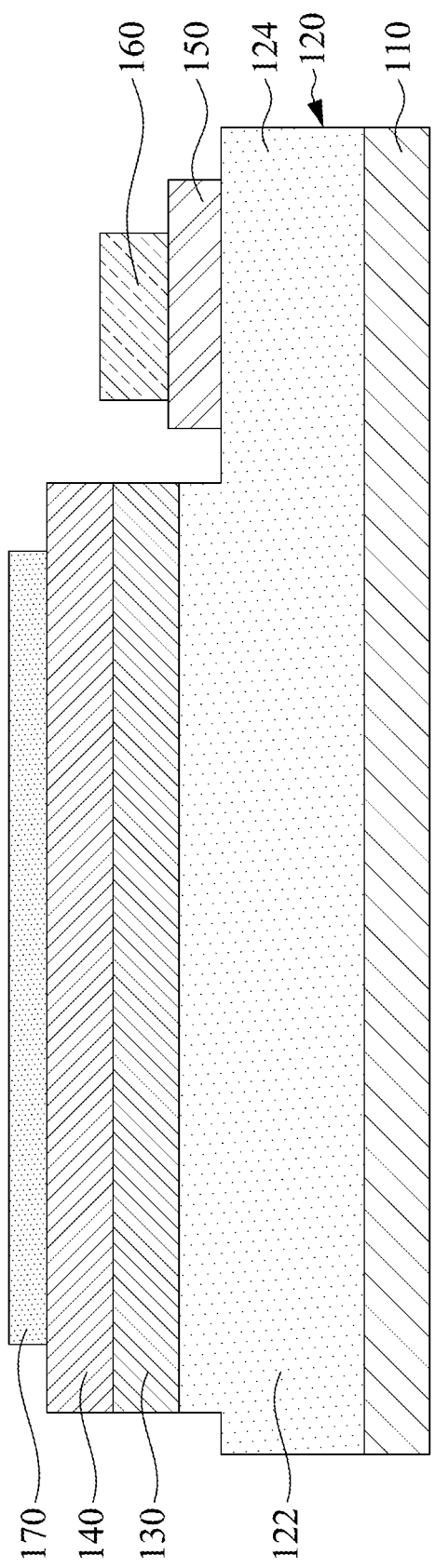

As shown in FIG. 6, in some embodiments, after the formation of the semi-finished light emitting diode structure as shown in FIG. 5, the first conductive layer 160 is formed on the semiconductor contacting layer 150, and the second conductive layer of 170 is formed on the second semiconductor layer 140. The width of the first conductive layer 160 is substantially less than that of the semiconductor contacting layer 150, and the width of the second conductive layer 170 is substantially less than that of the second semiconductor layer 140. That is, after the formation of the first conductive layer 160 and the second conductive layer 170, part of the upper surface of the semiconductor contacting layer 150 and part of the upper surface of the second semiconductor layer 140 will still be exposed. In one embodiment, the methods of forming or depositing the first conductive layer 160 include, but not limited to, chemical vapor deposition, physical vapor deposition, plasma enhanced chemical vapor deposition, atomic layer deposition, electroplating, or other appropriate process and/or a combination thereof. The material or composition of the first conductive layer 160 has been described in detail in the previous paragraph and will not be repeated here. In one embodiment, the methods of forming or depositing the second conductive layer 170 include, but not limited to, chemical vapor deposition, physical vapor deposition, plasma enhanced chemical vapor deposition, atomic layer deposition, electroplating, or other appropriate processes and/or a combination thereof. The material or composition of the second conductive layer 170 has been described in detail in the previous paragraph and will not be described here.

Figure 7:
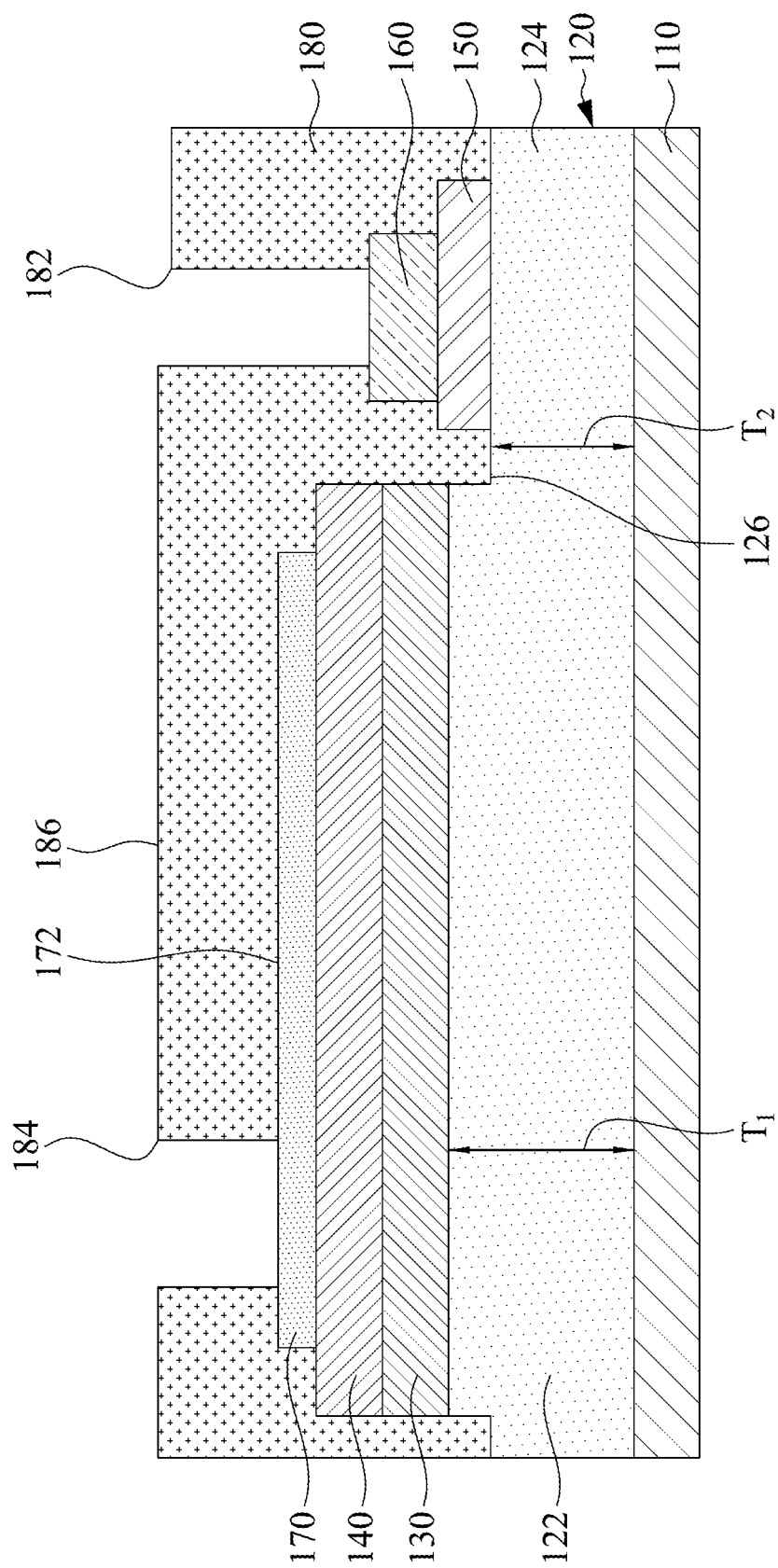

Next, please refer to FIG. 7, the insulating layer 180 is formed on the semi-finished light emitting diode structure formed in FIG. 6, and an etching or drilling process is performed to form the first opening 182 and the second opening 184. In order to briefly and simply describe the necessary techniques, the steps of pre-setting the anti-etching layer are not shown in FIG. 7. Specifically, the first opening 182 exposes part of the upper surface of the first conductive layer 160. That is, the insulating layer 180 covers the side walls of the first conductive layer 160 and the other part of the upper surface. Meanwhile, the insulating layer 180 covers the sidewalls of the semiconductor contacting layer 150, and the part of the upper surface that is not in contact with the first conductive layer 160. The second opening 184 exposes part of the upper surface of the second conductive layer 170. That is, the insulating layer 180 covers another part of the upper surface of the second conductive layer 170 and the sidewalls of the second conductive layer 170. In one embodiment, the methods of forming the insulating layer 180 include, but not limited to, chemical vapor deposition, physical vapor deposition, plasma enhanced chemical vapor deposition, atomic layer deposition, electroplating, or other appropriate process and/or a combination thereof. In one embodiment, the etching methods to form the first opening 182 and the second opening 184 include, but not limited to, wet etching, dry etching, chemical etching, physical etching, selective etching, or other suitable process and/or a combination thereof.

Figure 8:
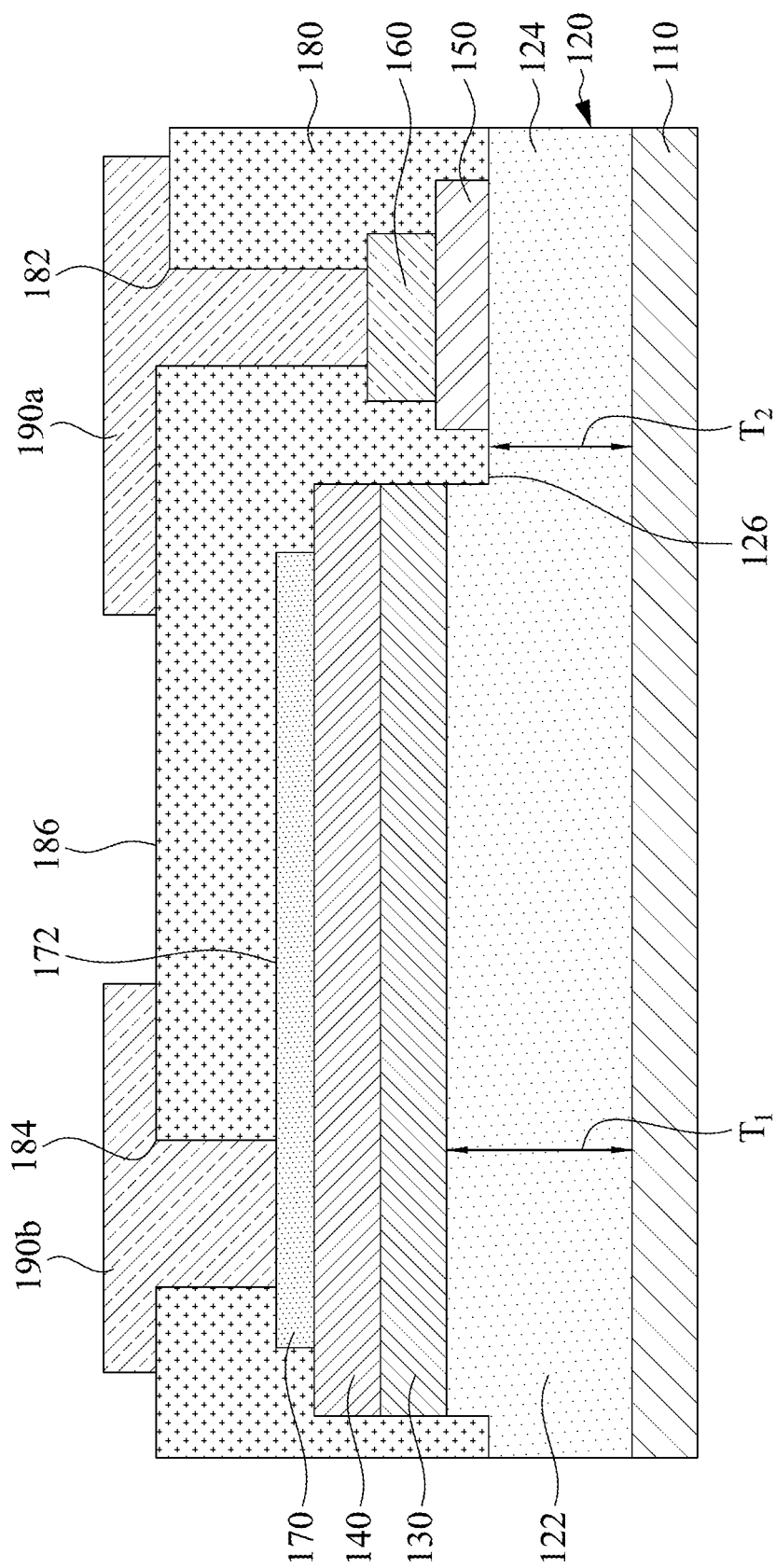

As shown in FIG. 8, in some embodiments, the first conductive pad 190a is formed in the first opening 182 and on part of the upper surface of the insulating layer 180. The first conductive pad 190a is electrically connected with the first conductive layer 160. In some embodiments, the second conductive pad 190b is formed in the second opening 184 and on part of the upper surface of the insulating layer 180. The second conductive pad 190b is electrically connected with the second conductive layer 170. In one embodiment, the formation methods of the first conductive pad 190a and the second conductive pad 190b include, but not limited to, chemical vapor deposition, physical vapor deposition, plasma enhanced chemical vapor deposition, atomic layer deposition, electroplating, or other appropriate process and/ or a combination thereof.

Through the above FIG. 3 to FIG. 8, the light emitting diode structure of the present disclosure is then completed. Its characteristic is that the semiconductor contacting layer 150 is formed on the second thickness structure 124 of the first semiconductor layer 120. By lowering the energy gap required for carrier transfer between the first semiconductor layer 120 and the first conductive layer 160, the forward operating voltage, the alloy temperature and the waste heat of the device are all reduced, the output power of the device is increased and the reliability of the device is improved.

Example 2

Figure 9:
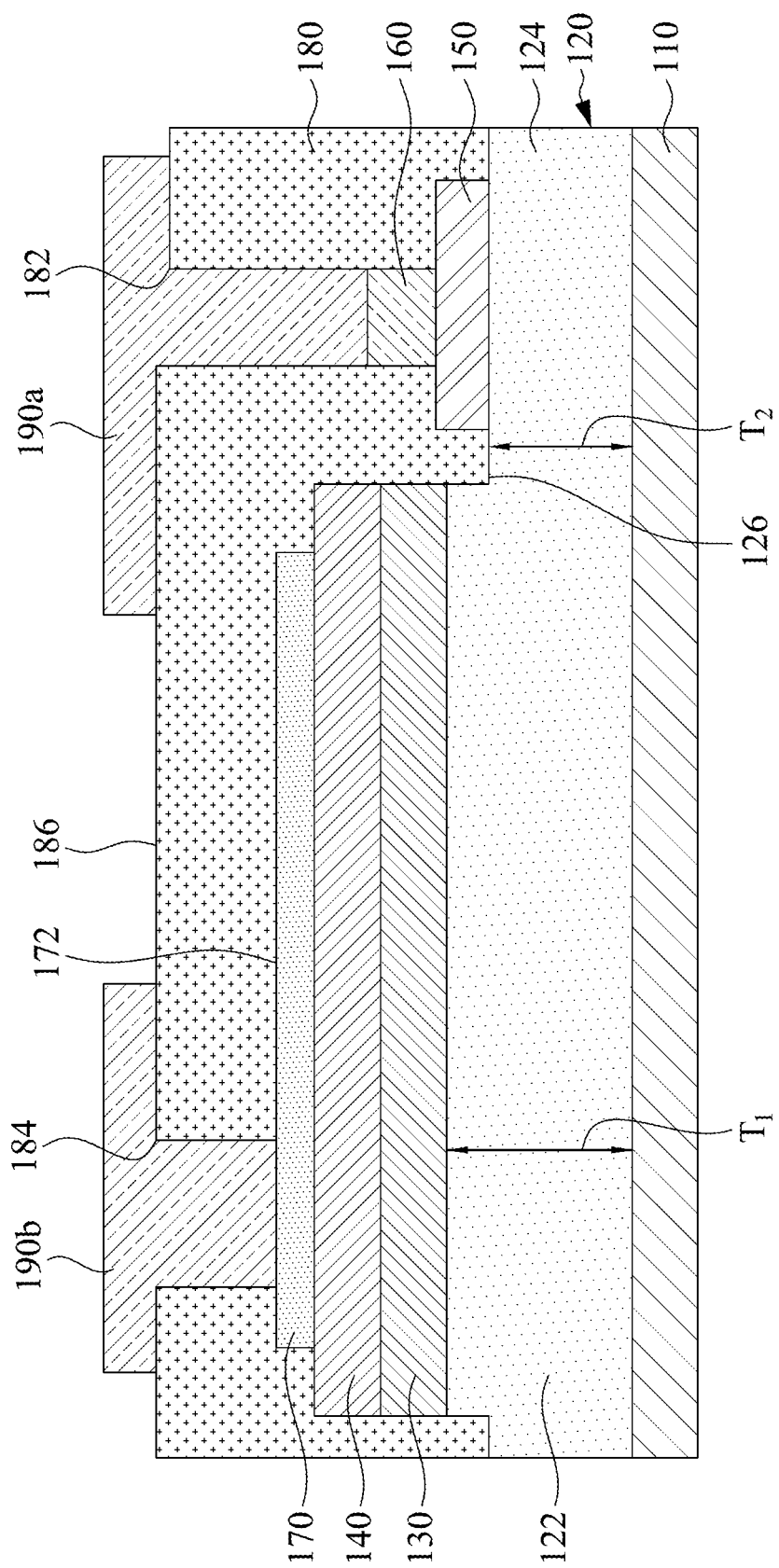
FIG. 9 is a cross-sectional view of the light emitting diode structure according to some other embodiments of the present disclosure.

Please refer to FIG. 9, FIG. 9 is a cross-sectional view of the light emitting diode structure according to some other embodiments of the present disclosure. It should be noted that, the features of FIG. 9 can be referred to both FIG. 6 and FIG. 7, which are detailed below.

In some embodiments, the step of forming the first conductive layer 160 in FIG. 6 could be switched with the step of forming the insulating layer 180, the first opening 182 and the second opening 184 in FIG. 7. That is, after forming the second conductive layer 170 on the second semiconductor layer 140, the insulating layer 180 is directly formed on the semi-finished light emitting diode structure. Then, the first opening 182 and the second opening 184 are etched. Specifically, the first opening 182 exposes part of the upper surface of the semiconductor contacting layer 150. That is, the insulating layer 180 covers both sidewalls of the semiconductor contacting layer 150 and another part of the upper surface.

As mentioned above, after switching part of the steps in FIG. 6 and FIG. 7, the first conductive layer 160 is continued to be formed in the first opening or deposited on the semiconductor contacting layer 150. In one embodiment, the width of the first conductive layer 160 is essentially equal to the width of the first opening 182 (FIG. 9), so the width of the first conductive layer 160 will be less than the width of the semiconductor contacting layer 150. Therefore, after the formation of the first conductive layer 160, the insulating layer 180 is deposited on the two sidewalls of the first conductive layer 160, and all the upper surfaces of the first conductive layer 160 are exposed in the first opening 182.

In Example 2, the subsequent steps are the same as in Example 1, that is, the first conductive pad 190a is formed in the first opening 182, on the first conductive layer 160, and on part of the upper surface of the insulating layer 180. The first conductive pad 190a is electrically connected with the first conductive layer 160. In addition, the second conductive pad 190b is formed in the second opening 184, and on part of the upper surface of the insulating layer 180. And, the second conductive pad 190b is electrically connected with the second conductive layer 170.

It should be noted that, for the sake of brevity, the sequential switching described in Example 2 is represented by FIG. 9. And, the preceding steps are stated only in words, and are not shown in the figures. However, the aforementioned process is still included in the scope of the present disclosure. Moreover, the types of processes used to form or manufacture the components in the foregoing parts are the same as those used in Example 1, so they will not be described here.

Example 3

Figure 10:
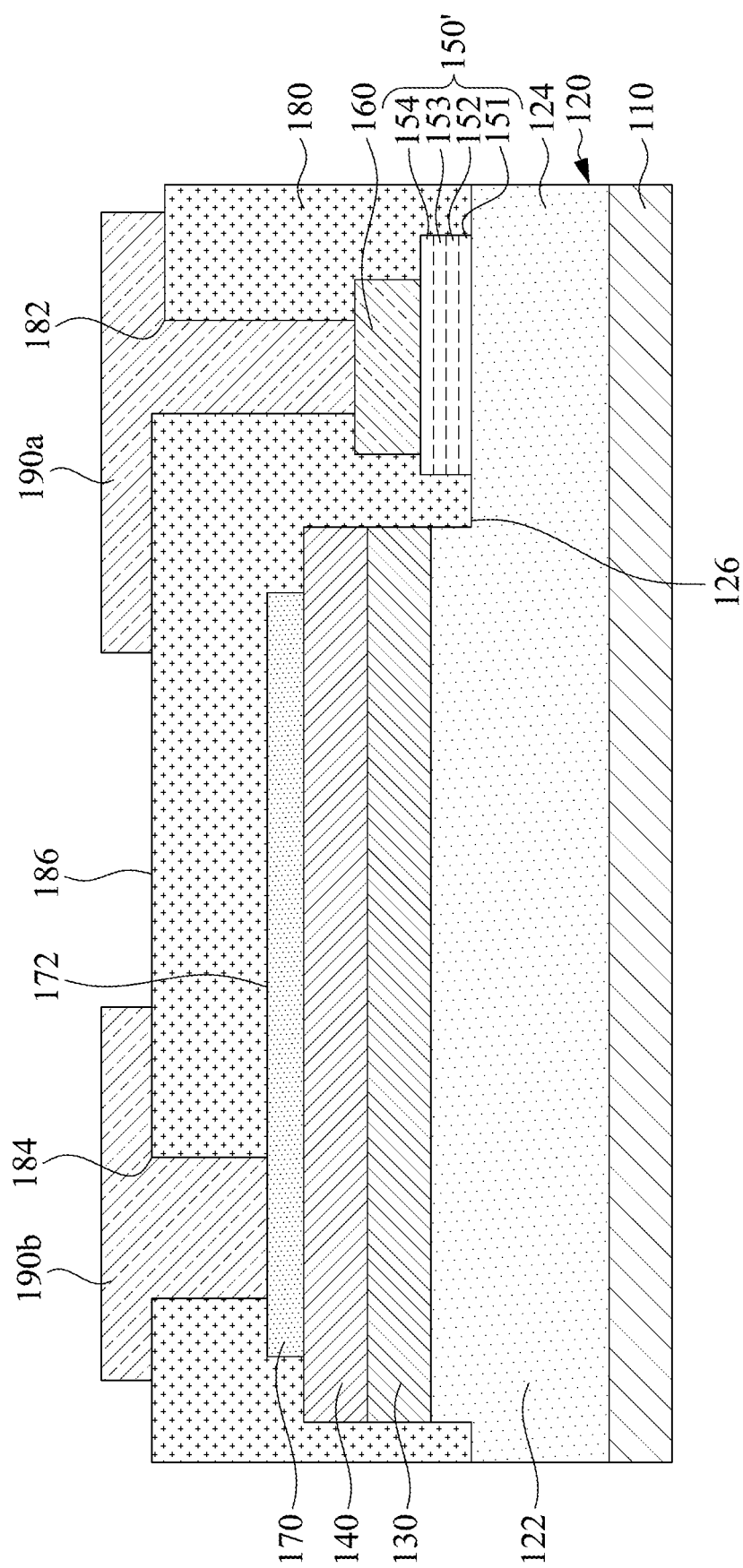
FIG. 10 is a cross-sectional view of the light emitting diode structure according to yet other embodiments of the present disclosure.

In other embodiments of the present disclosure, please refer to FIG. 10. FIG. 10 is a cross-sectional view of the light emitting diode structure according to yet other embodiments of the present disclosure. In the light emitting diode structure shown in FIG. 10, compared to FIG. 2, the main difference lies in the semiconductor contacting layer 150 '. In one embodiment, the semiconductor contacting layer 150' includes multiple sub-contacting layers 151, 152, 153, and 154. Please note that the 4 layers of the sub-contacting layers 151, 152, 153, and 154 are only exemplary, and should not be used to define the present disclosure. Any sub-contacting layers more or less than 4 layers should fall within the scope of the present disclosure.

In some examples, the doping concentrations of each sub-contacting layer 151, 152, 153, and 154 could be different, and each sub-contacting layer 151, 152, 153, and 154 could be stacked from top to bottom according to the doping concentration. That is, the doping concentration of each sub-contacting layer 151, 152, 153 and 154 gradually decreases from the position near the first conductive layer 160 to the direction of the second thickness structure 124 of the first semiconductor layer 120. Specifically, in one example of the present disclosure, the silicon doping concentration of the sub-contacting layer 151 is about $2\times10^{19}$/cm$^3$, the silicon doping concentration of the sub-contacting layer 152 is about $4\times10^{19}$/cm$^3$, the silicon doping concentration of the sub-contacting layer 153 is about $6\times10^{19}$/cm$^3$, and the silicon doping concentration of the sub-contacting layer 154 is about $8\times10^{19}$/cm$^3$.

In other examples, all sub-contacting layers 151, 152, 153, and 154 have at least two doping concentrations and are stacked alternately from top to bottom according to the doping concentration. That is, each sub-contacting layer 151, 152, 153 and 154 can be stacked alternately from top to bottom according to two or more doping concentrations. Specifically, in one example of the present disclosure, the silicon doping concentration of the sub-contacting layer 151 is about $4\times10^{19}$/cm$^3$, the silicon doping concentration of the sub-contacting layer 152 is about $8\times10^{19}$/cm$^3$, the silicon doping concentration of the sub-contacting layer 153 is about $4\times10^{19}$/cm$^3$, and the silicon doping concentration of the sub-contacting layer 154 is about $8\times10^{19}$/cm$^3$. It can be seen that the stacking mode of each sub-contacting layer 151, 152, 153 and 154 can be stacked alternately from top to bottom according to two or more doping concentrations.

In yet other examples, each sub-contacting layer 151, 152, 153, and 154 includes $Al_xGa_yIn_{1-x-y}N$, in which $0 \leq x$, $y \leq 1$. Moreover, all sub-contacting layers 151, 152, 153 and 154 have $x+y=1$, the doping concentration of the sub-contacting layer 154 adjacent to the first conductive layer 160 is greater than that of the other sub-contacting layers 151, 152 and 153. Specifically, in one example of the present disclosure, each sub-contacting layer 151, 152, 153 and 154 is $Al_x$-$Ga_yIn_{1-x-y}N$, and when $0 \leq x$, $y \leq 1$ and $x+y=1$, each sub-contacting layer 151, 152, 153 and 154 does not contain indium (In). For example, the sub-contacting layer 151 is $Al_{0.3}Ga_{0.7}N$, the sub-contacting layer 152 is $Al_{0.2}Ga_{0.8}N$, the sub-contacting layer 153 is $Al_{0.1}Ga_{0.9}N$, and the sub-contacting layer 154 is GaN. At this point, the silicon doping concentration of the sub-contacting layer 151 is about $2 \times 10^{19}/cm^3$, the silicon doping concentration of the sub-contacting layer 152 is about $2.5 \times 10^{19}/cm^3$, the silicon doping concentration of the sub-contacting layer 153 is about $3.8 \times 10^{19}/cm^3$, and the silicon doping concentration of the sub-contacting layer 154 is about $6 \times 10^{19}/cm^3$.

In yet other examples, each of the sub-contacting layers 151, 152, 153, and 154 includes $Al_xGa_yIn_{1-x-y}N$, in which $0 \leq x$, $y \leq 1$. Among them, the sub-contacting layer 154 adjacent to the first conductive layer 160 is $Ga_yIn_{1-y}N$, and $0 < y < 1$. This means that, the sub-contacting layers 151, 152, and 153 may or may not contain indium, while the sub-contacting layer 154 adjacent to the first conductive layer 160 contains no aluminum and must contain indium. The contacting resistance between GaInN (the sub-contacting layer 154) and the first conductive layer 160 can be effectively reduced through the narrow energy gap on the surface. And, the lattice mismatch between GaInN (the sub-contacting layer 154) and the first semiconductor layer 120 can be buffered by the gradient AlGaInN (the sub-contacting layers 151, 152, and 153). Specifically, in one example of the present disclosure, the sub-contacting layer 151 is $Al_{0.3}Ga_{0.7}N$, the sub-contacting layer 152 is $Al_{0.2}Ga_{0.7}In_{0.1}N$, the sub-contacting layer 153 is $Al_{0.1}Ga_{0.8}In_{0.1}N$, and the sub-contacting layer 154 is $Ga_{0.9}In_{0.1}N$. That is, the sub-contacting layers 151, 152 and 153 include $Al_xGa_yIn_{1-x-y}N$, in which $0 \leq x$, $y \leq 1$. Moreover, the sub-contacting layer 154 adjacent to the first conductive layer 160 is $Ga_yIn_{1-y}N$, in which $0 < y < 1$. In brief, the sub-contacting layers 151, 152 and 153 may or may not contain indium, while the sub-contacting layer 154 adjacent to the first conductive layer 160 does not contain aluminum and must contain indium.

In yet other examples, each sub-contacting layer 151, 152, 153, and 154 could be stacked in order according to energy gaps or alternatively stacked in accordance with at least two energy gaps. Among all sub-contacting layers 151, 152, 153, and 154, there are two energy gaps or more. And, the sub-contacting layer 151, 152, 153, and 154 are stacked alternately from top to bottom according to the energy gaps. That is, each sub-contacting layer 151, 152, 153 and 154 can be stacked alternately from top to bottom according to two energy gaps or more. Specifically, in one example of the present disclosure, the energy gap of the sub-contacting layer 151 is about 2.4 eV, the energy gap of the sub-contacting layer 152 is about 2.1 eV, the energy gap of the sub-contacting layer 153 is about 2.0 eV, and the energy gap of the sub-contacting layer 154 is about 1.5 eV. Each sub-contacting layer 151, 152, 153 and 154 can be stacked in order according to energy gaps. In another example of the present disclosure, the energy gap of the sub-contacting layer 151 is about 2.0 eV, the energy gap of the sub-contacting layer 152 is about 1.5 eV, the energy gap of the sub-contacting layer 153 is about 2.0 eV, and the energy gap of the sub-contacting layer 154 is about 1.5 eV. Each sub-contacting layer 151, 152, 153 and 154 can be stacked alternately from top to bottom according to two energy gaps or more.

Example 4

Figure 11:
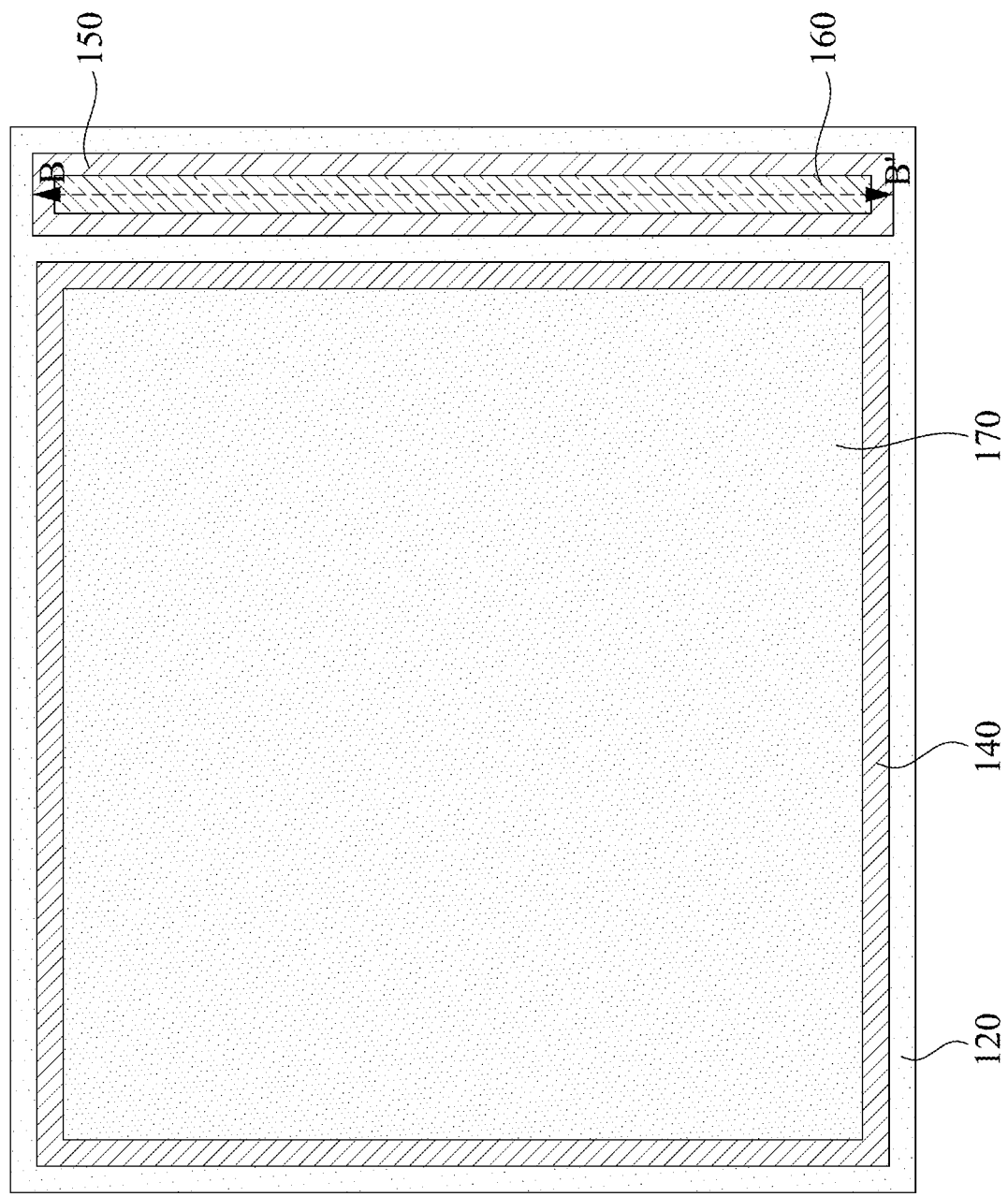
FIG. 11 is a top view of a light emitting diode structure according to some embodiments of the present disclosure.
Figure 12:
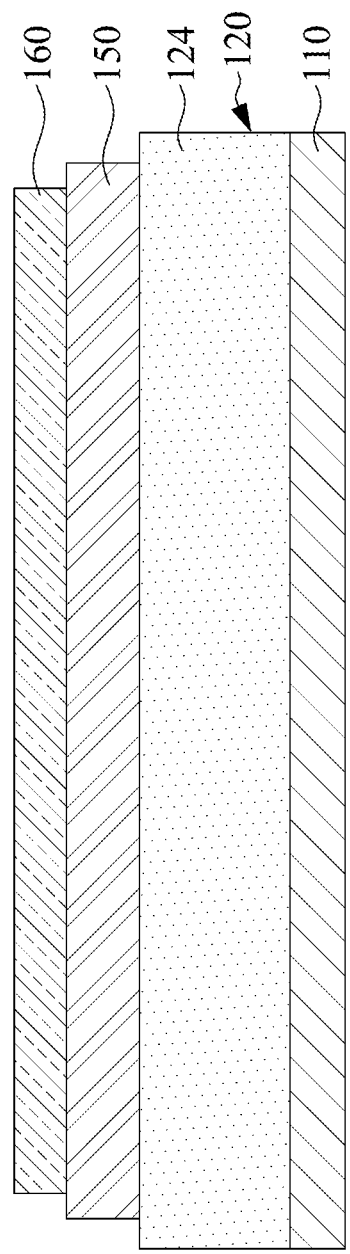
FIG. 12 is a cross-sectional view of the light emitting diode structure according to the section line BB' in FIG. 11.

Please refer to FIG. 11 and FIG. 12 first. FIG. 11 is a top view of a light emitting diode structure according to some embodiments of the present disclosure. FIG. 12 is a cross-sectional view of the light emitting diode structure according to the section line BB' in FIG. 11. The light emitting diode shown in FIG. 11 and FIG. 12 are the same as the aforementioned light emitting diode shown in FIG. 1 and FIG. 2. And, FIG. 12 uses the section line BB' in FIG. 11 as a visual reference. According to FIG. 12, in some embodiments, the semiconductor contacting layer 150, located on the second thickness structure 124 of the first semiconductor layer 120, presents a continuous and integral structure. However, the semiconductor contacting layer 150 described in the present disclosure also has a discontinuous or disintegrable structure, of which the characteristics and structure are detailed below.

Figure 13:
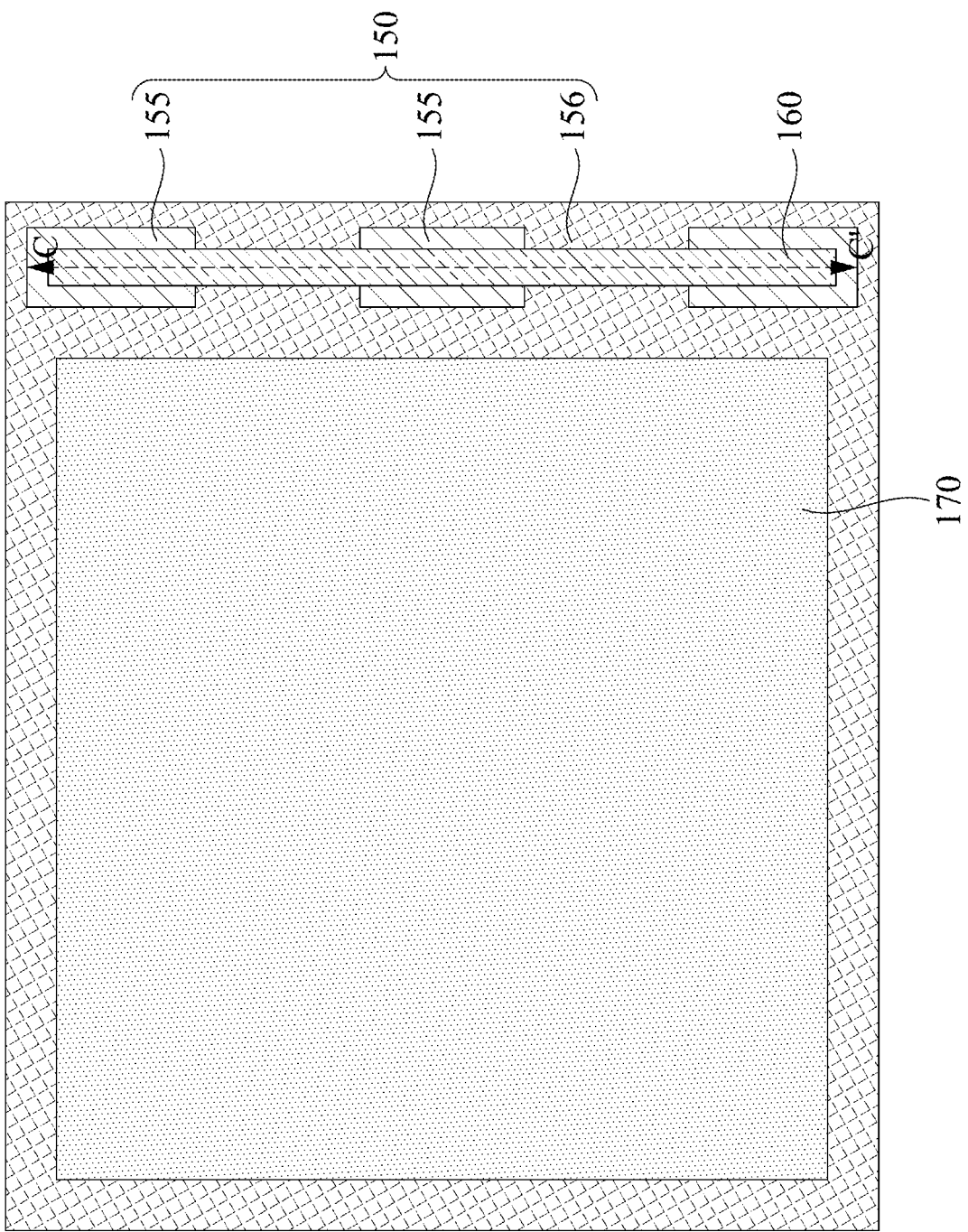
FIG. 13 is a top view of a light emitting diode structure according to some other embodiments of the present disclosure.
Figure 14:
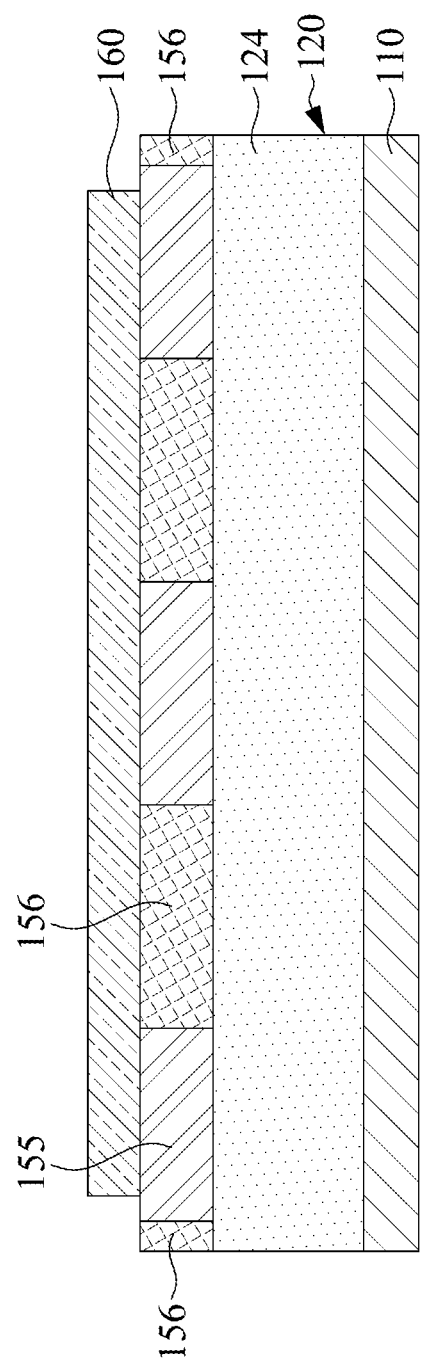
FIG. 14 is a cross-sectional view of the light emitting diode structure according to the section line CC' in FIG. 13.

In yet other embodiments, please refer to FIG. 13 and FIG. 14 simultaneously. FIG. 13 is a top view of a light emitting diode structure according to some other embodiments of the present disclosure. It should be noted that, the first semiconductor layer 120, the light emitting layer 130 and the second semiconductor layer 140 are not shown in FIG. 13. FIG. 14 is a cross-sectional view of the light emitting diode structure according to the section line CC' in FIG. 13. In yet other embodiments of the present disclosure, as shown in FIG. 13, the semiconductor contacting layer 150 includes multiple independent contacting layers 155 and an insulating part 156, and any two adjacent independent contacting layers 155 are separated from each other by the insulating part 156. Specifically, the independent contacting layer 155 and the insulating part 156 are disposed alternately. In addition, each of the independent contacting layers 155 is electrically connected with the first semiconductor layer 120 and the first conductive layer 160. In addition, in one embodiment, the insulating part 156 is connected with the subsequently formed insulating layer 180, and covers the semi-finished light emitting diode structure. In one embodiment, after the semiconductor contacting layer 150 is formed, the formation method of the independent contacting layer 155 includes, but not limited to, wet etching, dry etching, chemical etching, physical etching, selective etching, or other suitable process and/or a combination thereof. In one embodiment, the method of forming the insulating part 156 between each of the independent contacting layers 155 includes, but not limited to, chemical vapor deposition, physical vapor deposition, plasma enhanced chemical vapor deposition, atomic layer deposition, electroplating, or other appropriate process and/or a combination thereof. In one embodiment, the material of the insulating part 156 may include, but not limited to, silicon oxide, silicon nitride, silicon oxynitride, epoxy resin, or other suitable insulating material. In one embodiment, the shape of the insulating part 156 may include, but not limited to, a dot, block, sphere, or other suitable shape.

As mentioned above, when the semiconductor contacting layer 150 is processed to form multiple independent contacting layers 155, the overall area of the semiconductor contacting layer 150 will be reduced, thus reducing the light absorption probability of the semiconductor contacting layer 150. At the same time, because the insulating part 156 is filled between each of the independent contacting layers 155, the current is dispersed, and the forward operating voltage is further reduced.

Example 5

Figure 15:
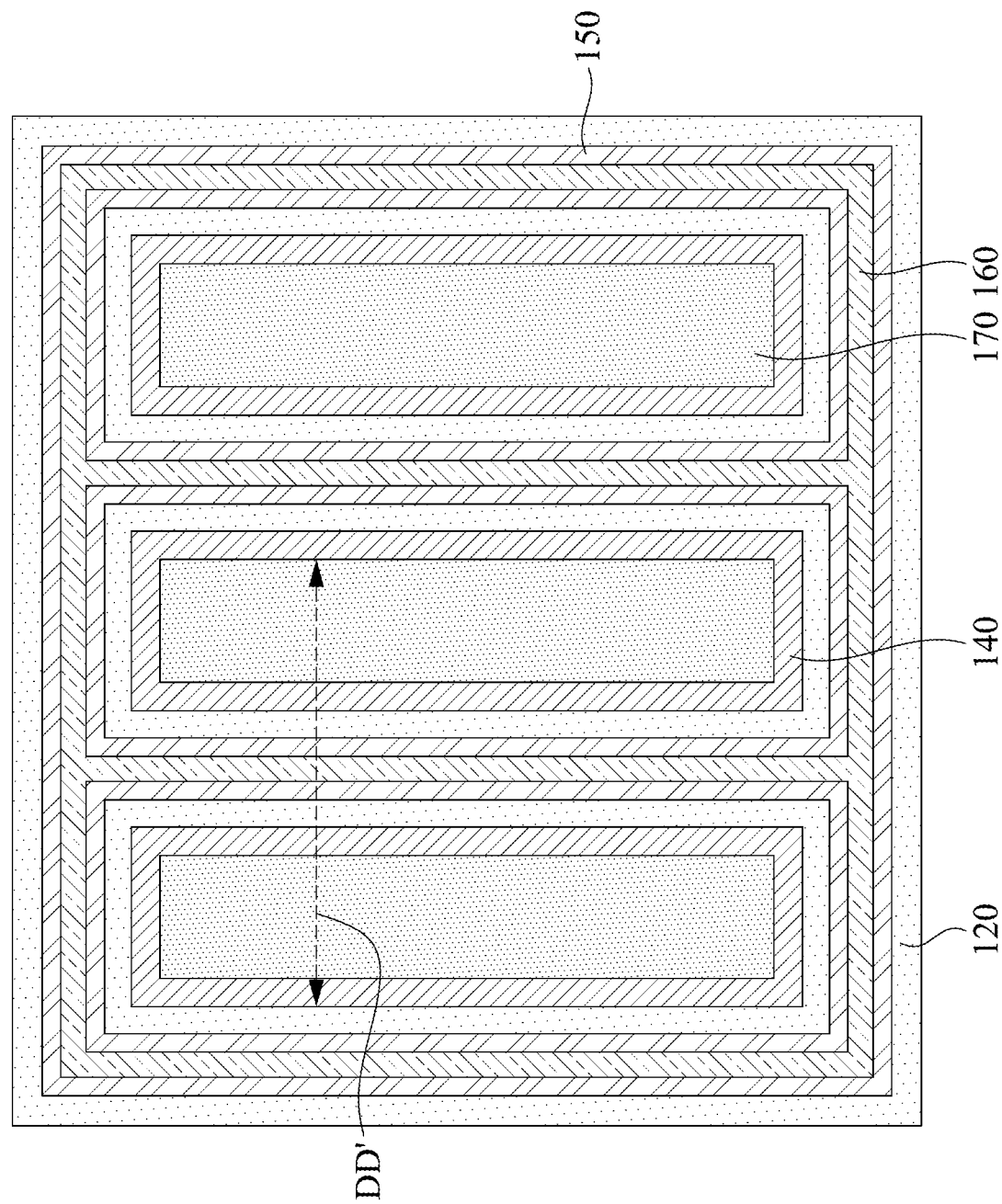
FIG. 15 is a top view of a light emitting diode structure according to yet other embodiments of the present disclosure.
Figure 16:
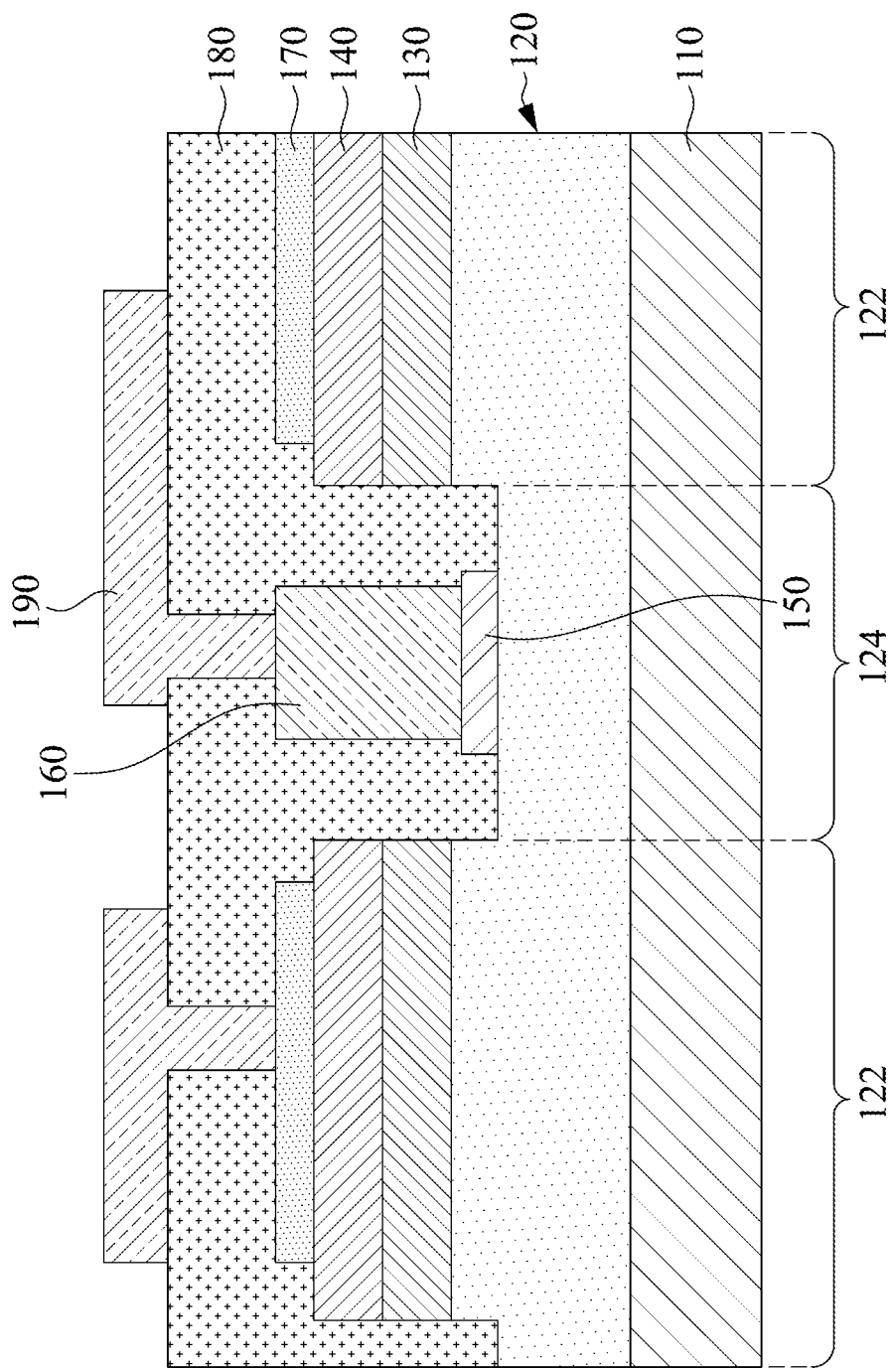
FIG. 16 is a cross-sectional view of the light emitting diode structure according to the section line DD' in FIG. 15.

Please refer to FIG. 4, FIG. 15 and FIG. 16 simultaneously. FIG. 15 is a top view of a light emitting diode structure according to yet other embodiments of the present disclosure. FIG. 16 is a cross-sectional view of the light emitting diode structure according to the section line DD' in FIG. 15. It should be noted that the insulating layer 180 and the conductive pad 190 in FIG. 16 are not shown in FIG. 15 for easy reference. In yet other embodiments of the present disclosure, the etched portion can be adjusted during the etching step in FIG. 4 to form the light emitting diode structure as shown in FIG. 15. Specifically, in FIG. 15, the portion with the semiconductor contacting layer 150 is the portion being etched, compared to FIG. 4, where only one end of the light emitting diode structure is etched. Further, by the section line DD', the light emitting diode structure etched with adjustment is shown in FIG. 16. The semiconductor contacting layer 150 is located at the second thickness structure 124. On both sides away from the semiconductor contacting layer 150, there can be layered structures composed of the first thickness structure 122 of the first semiconductor layer 120, the light emitting layer 130 and the second semiconductor layer 140, and etc.

As mentioned above, in Example 5, 3 layered structures are formed, which all have the first thickness structure 122 of the first semiconductor layer 120, the light emitting layer 130, and the second semiconductor layer 140, and etc. However, it should be noted that, the example formed here are only exemplary, and more or less layered structures or semiconductor contacting layers 150 should fall within the scope of the present disclosure.

Example 6

Figure 17:
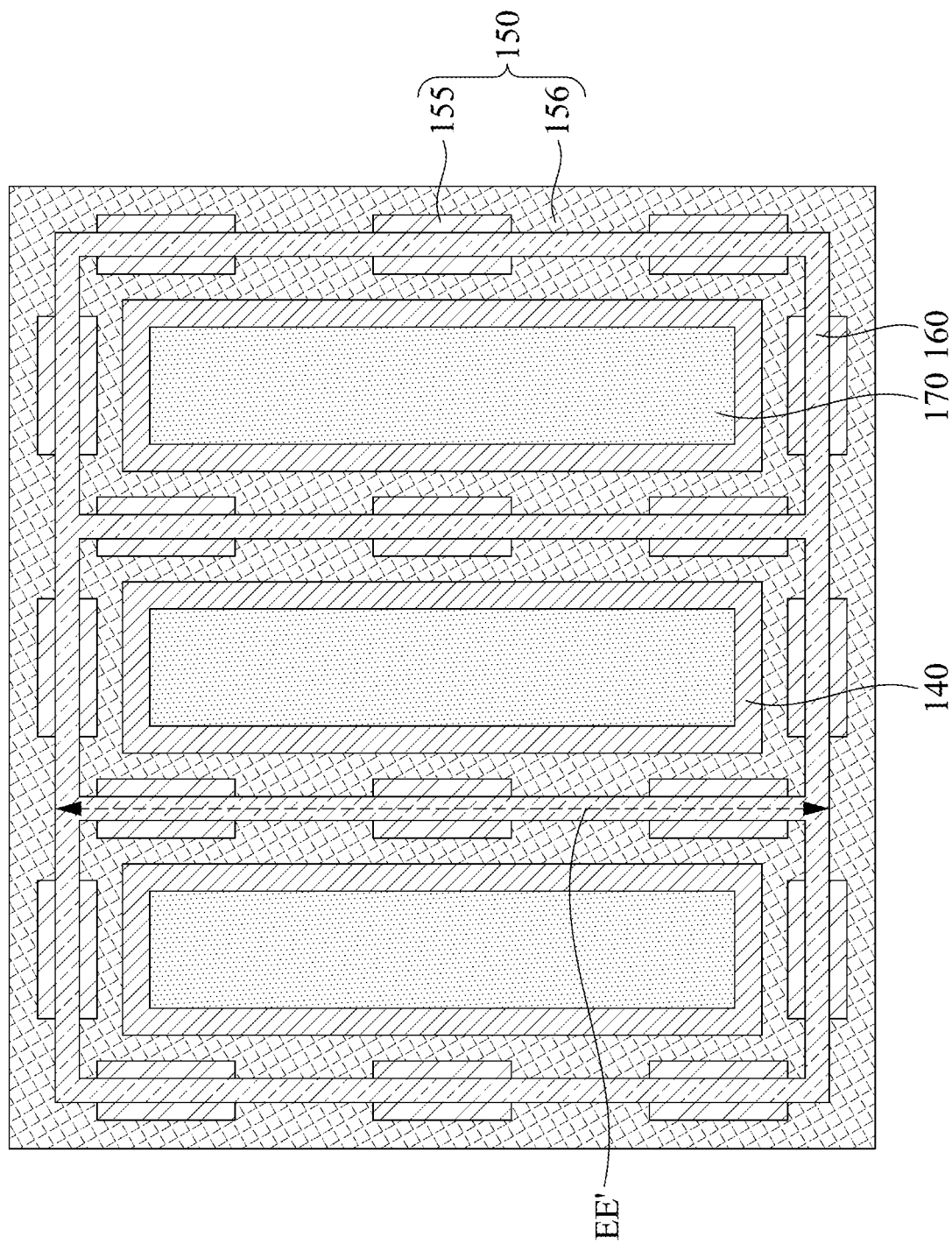
FIG. 17 is a top view of a light emitting diode structure according to yet other embodiments of the present disclosure.
Figure 18:
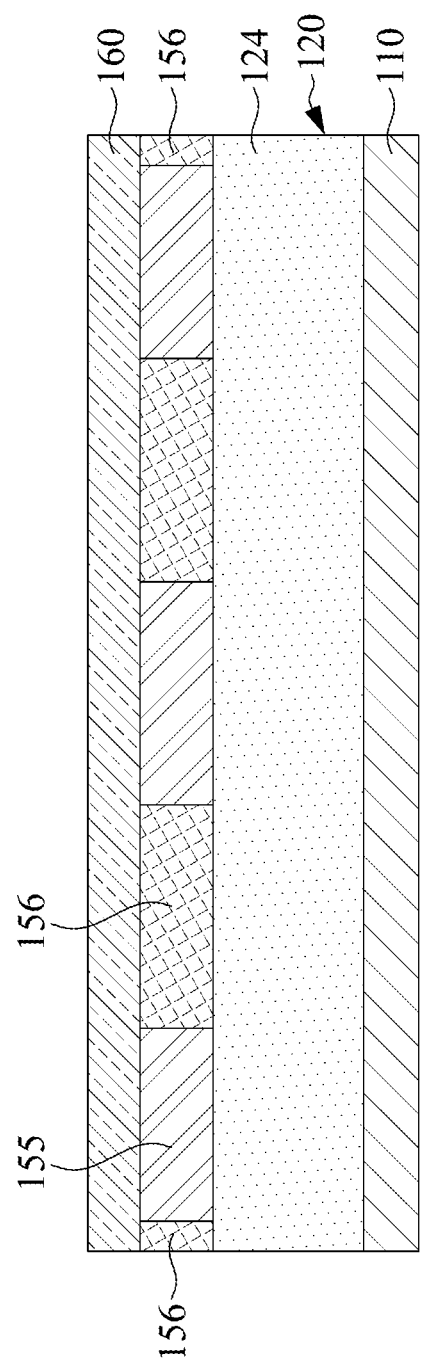
FIG. 18 is a cross-sectional view of the light emitting diode structure according to the section line EE' in FIG. 17.

Please refer to FIG. 17 and FIG. 18 simultaneously. FIG. 17 is a top view of a light emitting diode structure according to yet other embodiments of the present disclosure. Note that the first semiconductor layer 120 is not shown in FIG. 17. FIG. 18 is a cross-sectional view of the light emitting diode structure according to the section line EE' in FIG. 17. Similar to the example in FIG. 13 and FIG. 14, in Example 6, the semiconductor contacting layer 150 includes multiple independent contacting layers 155 and the insulating part 156. Any two adjacent independent contacting layers 155 are separated from each other by the insulating part 156. In addition, in one embodiment, the insulating part 156 is connected with the subsequently formed insulating layer 180, and covers the semi-finished light emitting diode structure. In addition, each of the independent contacting layers 155 is electrically connected with the first semiconductor layer 120 and the first conductive layer 160. In one example, the etching and formation methods of the independent contacting layer 155 and the insulating part 156 described in Example 6 are the same as in Example 4, and therefore are not described herein. Moreover, the material of insulating part 156 is the same as that of Example 4.

As mentioned above, when the semiconductor contacting layer 150 is processed to form multiple independent contacting layers 155, the overall area of the semiconductor contacting layer 150 will be reduced, thus reducing the light absorption probability of the semiconductor contacting layer 150. At the same time, because the insulating part 156 is filled between each of the independent contacting layers 155, the current is dispersed and the forward operating voltage is further reduced.

Example 7

Figure 19:
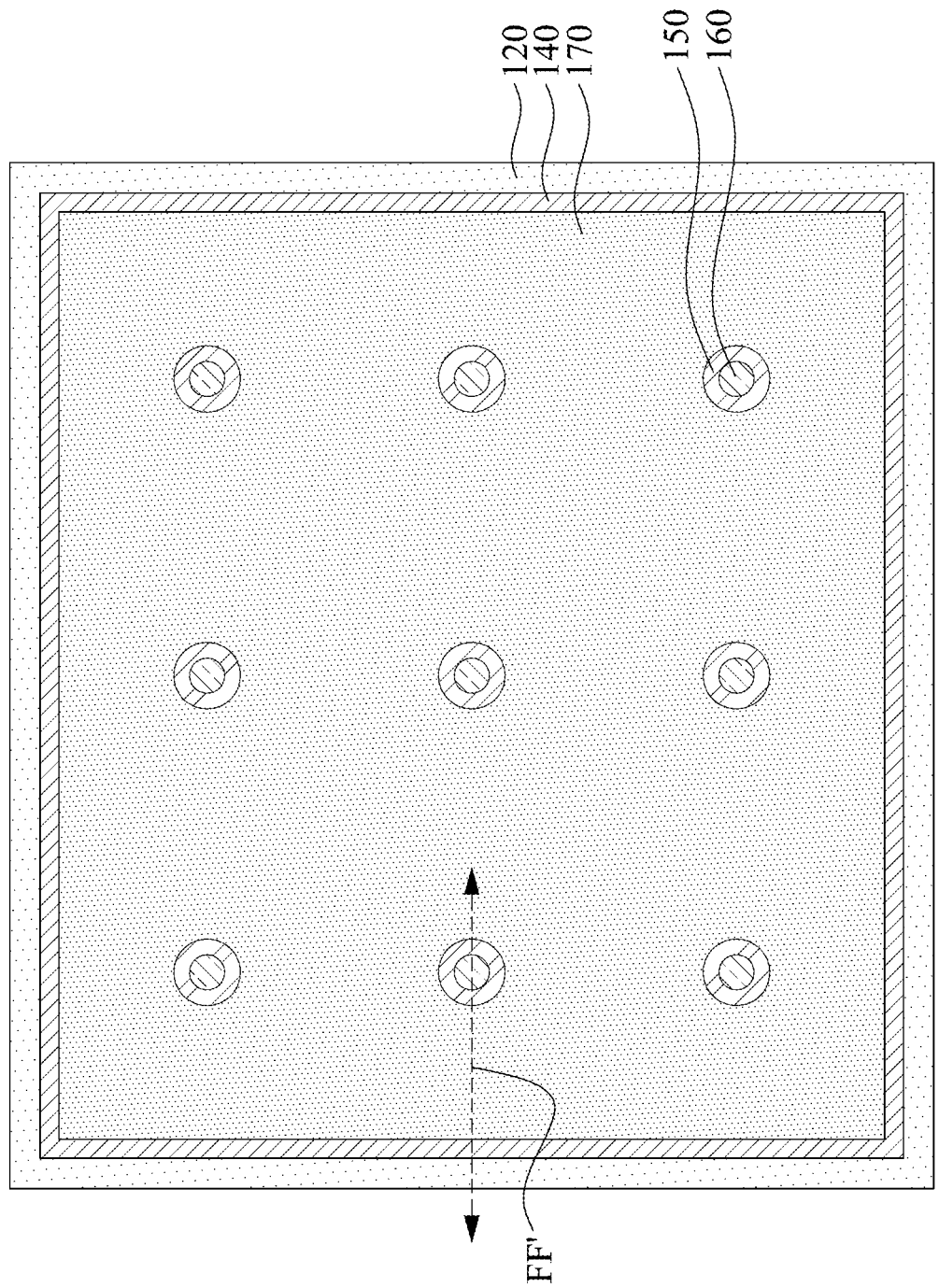
FIG. 19 is a top view of a light emitting diode structure according to yet other embodiments of the present disclosure.
Figure 20:
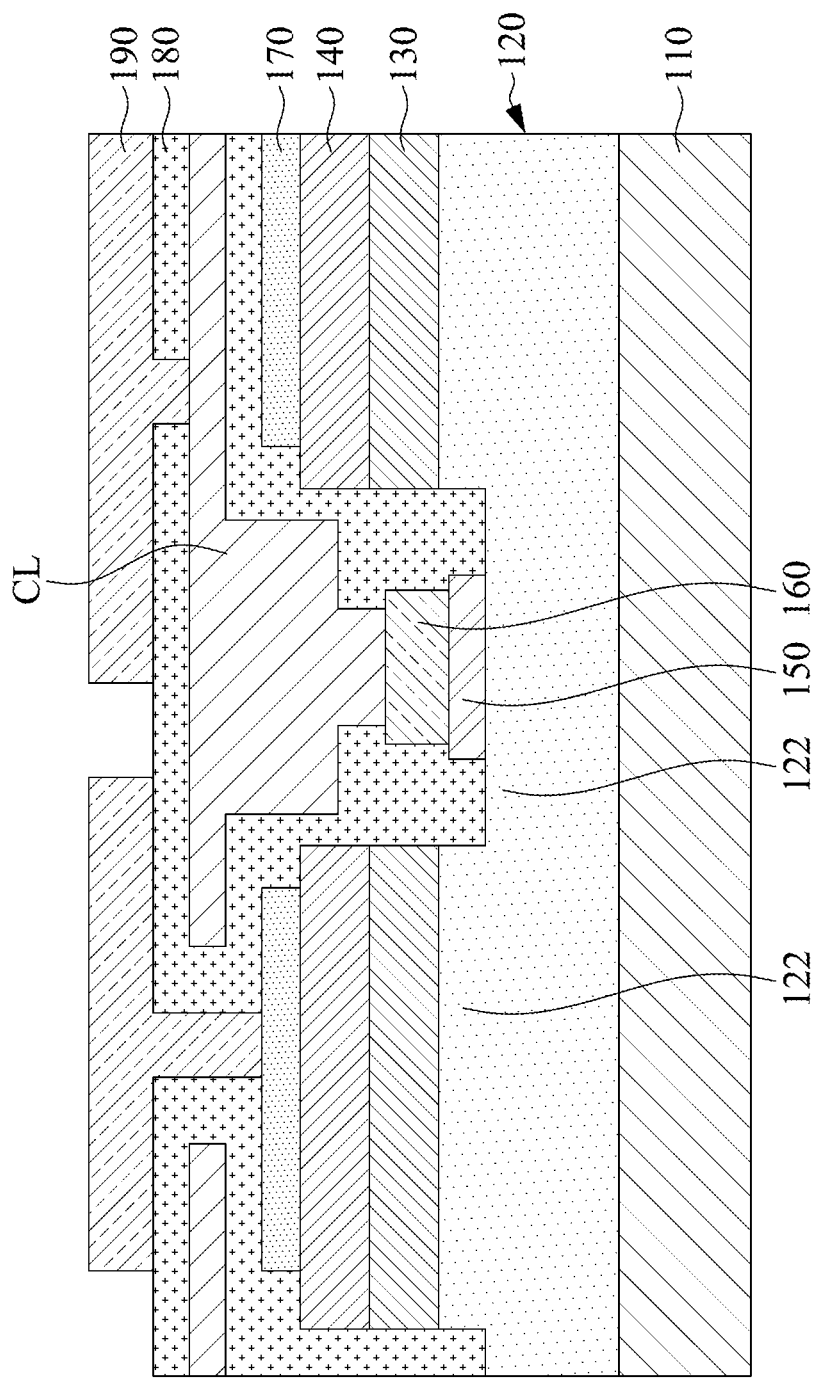
FIG. 20 is a cross-sectional view of the light emitting diode structure according to the section line FF' in FIG. 19.

Please refer to FIG. 19 and FIG. 20 simultaneously. FIG. 19 is a top view of a light emitting diode structure according to yet other embodiments of the present disclosure. FIG. 20 is a cross-sectional view of the light emitting diode structure according to the section line FF' in FIG. 19. It should be noted that the conductive connecting layer CL, the insulating layer 180 and the first conductive pad 190 in FIG. 20 are not shown in FIG. 19 for easy reference. As shown in FIG. 19, in top view, it can be seen that the light emitting diode structure of the present disclosure includes multiple semiconductor contacting layers 150, and multiple first conductive layers 160 disposed on the semiconductor contacting layers 150. Then, referring to FIG. 20 by section line FF', since each of the semiconductor contacting layers 150 is electrically isolated from each other, the conductive connecting layer CL is disposed to electrically connect each of the semiconductor contacting layers 150 to each other, and further electrically connect each of the semiconductor contacting layers 150 with the first conductive pad 190. In one example, after forming the semi-finished light emitting diode structure shown in FIG. 3, drilling or etching process will be used to form multiple holes, such formation method includes, but not limited to, wet etching, dry etching, chemical etching, physical etching, selective etching, or other suitable etching process and/or their combination. Subsequently, each of the semiconductor contacting layers 150 and the first conductive layer 160 are formed in the hole by means of, but not limited to, chemical vapor deposition, physical vapor deposition, plasma enhanced chemical vapor deposition, atomic layer deposition, electroplating, or other appropriate processes and/or combinations thereof. In one example, materials of the conductive connecting layer CL include, but not limited to, transparent conductive materials including indium tin oxide, indium zinc oxide, aluminum zinc oxide, or a material having a transparent conductive effect; or, an opaque metal material, e.g., a metal material containing chromium, gold, titanium, aluminum, vanadium, or a similar opaque metal material.

As described above, the overall area of each of the semiconductor contacting layers 150 is reduced, thereby reducing the light absorption probability of the semiconductor contacting layer 150 and further reducing the forward operating voltage. It should be noted that the example shown here is only exemplary, and that more or less of the semiconductor contacting layers 150 should be included in the scope of the present disclosure.

Example 8

Figure 21:
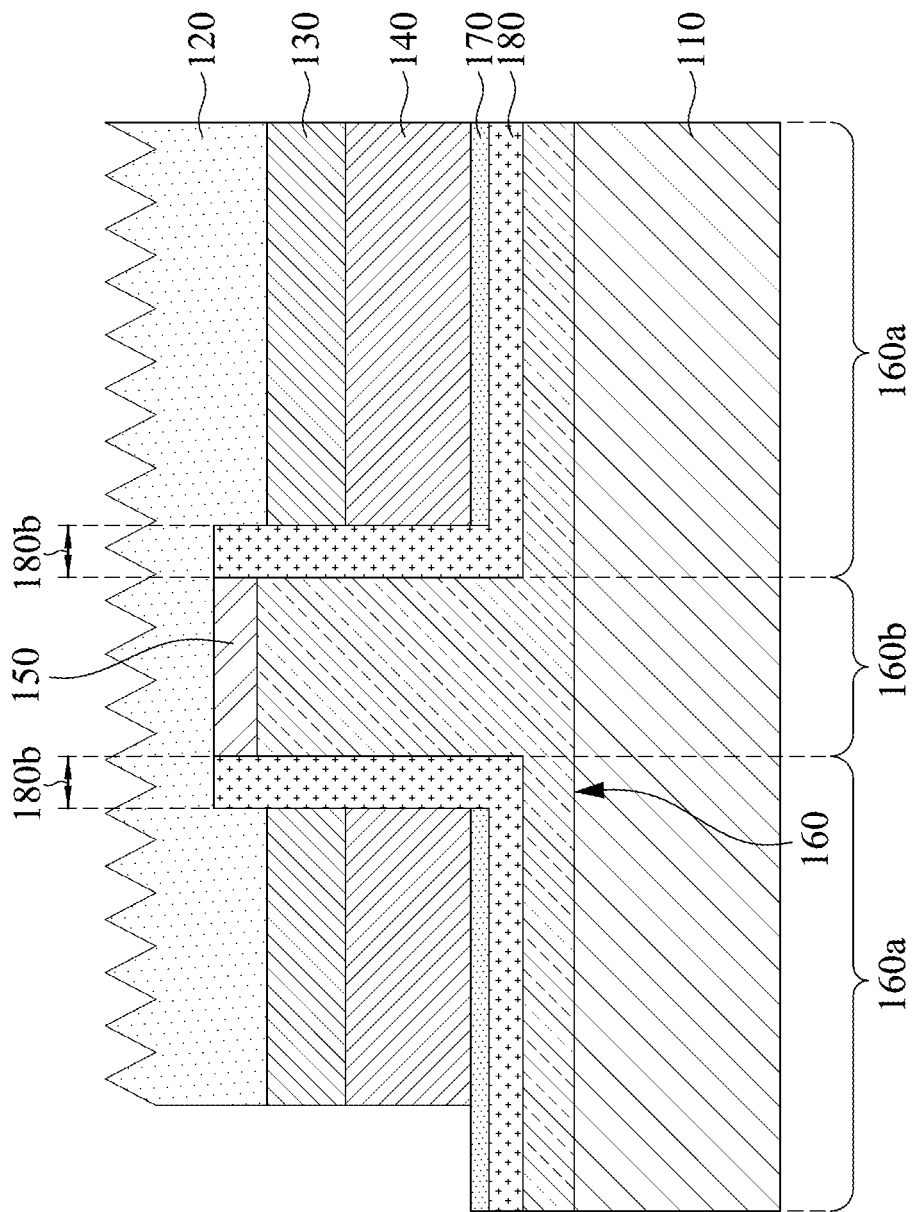
FIG. 21 is a cross-sectional view of the light emitting diode structure according to yet other embodiments of the present disclosure.

Please refer to FIG. 21, FIG. 21 is a cross-sectional view of the light emitting diode structure according to yet other embodiments of the present disclosure. In Example 8, the light emitting diode structure includes a substrate 110, a first conductive layer 160, an insulating layer 180, a second conductive layer 170, a second semiconductor layer 140, a light emitting layer 130, a semiconductor contacting layer 150, and a first semiconductor layer 120. In one example, as shown in FIG. 21, a second conductive layer 170 is disposed on the substrate 110. The second semiconductor layer 140 is disposed on the second conductive layer 170. The light emitting layer 130 is disposed on the second semiconductor layer 140. The first semiconductor layer 120 is disposed on the light emitting layer 130, and the doping type of the first semiconductor layer 120 is different from that of the second semiconductor layer 140. The first conductive layer 160 is disposed between the substrate 110 and the second conductive layer 170. The first conductive layer 160 has a base part 160a and a protruding part 160b. The protruding part 160b penetrates through the second conductive layer 170, the second semiconductor layer 140 and the light emitting layer 130, so as to electrically connect with the first semiconductor layer 120. The insulating layer 180 is disposed between the first conductive layer 160 and the second conductive layer 170. The semiconductor contacting layer 150 is disposed between the protruding part 160b of the first conductive layer 160 and the first semiconductor layer 120. The doping type of the semiconductor contacting layer 150 is the same as that of the first semiconductor layer 120. Among them, the protruding part 160b of the first conductive layer 160 and the semiconductor contacting layer 150 are electrically isolated from the second conductive layer 170, the second semiconductor layer 140 and the light emitting layer 130 by an extending part 180b of the insulating layer 180. It should be noted that, materials and manufacturing processes of the light emitting diode structure and its components described in Example 8 have been described in the previous examples, so they will not be repeated here.

Example 9

For the semiconductor contacting layer 150 formed in Example 1 to Example 8, the semiconductor contacting layer 150 may have more than one through holes 157. It should be noted that, for simplicity, the through holes 157 are not shown in the semiconductor contacting layer 150 in FIG. 1 to FIG. 21. For the aforementioned through holes 157, please refer to FIG. 22. FIG. 22 is a schematic diagram of the light emitting diode structure according to yet other embodiments of the present disclosure. As can be seen from FIG. 22, after enlarging parts of the semiconductor contacting layer 150 and the first conductive layer 160 of the light emitting diode structure, it can be found that the appearance of the semiconductor contacting layer 150 has many through holes 157. Regarding the through holes 157, the reason is that when the semiconductor contacting layer 150 is formed by the secondary growth process and the thickness of the formed semiconductor contacting layer 150 is relatively thin, the semiconductor contacting layer 150 will be an incomplete film. That is, the semiconductor contacting layer 150 will have a random distribution of multiple through holes 157. Then, when the first conductive layer 160 is formed on the semiconductor contacting layer 150 in the subsequent manufacturing process, part of the first conductive layer 160 will be filled into the through holes 157. Furthermore, the contacting area between the semiconductor contacting layer 150 and the first conductive layer 160 will be increased, thereby reducing the contacting resistance more effectively. In one example of the present disclosure, the thickness of the semiconductor contacting layer 150 formed by the secondary growth process is from about 400 nm to about 50 nm.

In summary, the present disclosure enables the N-type electrode to form ohmic contacting by growing a thin semiconductor contacting layer (or ohmic contacting layer) on the N-type semiconductor layer. As such, it's possible for us to achieve the effect of reducing the forward operating voltage, alloy temperature and component waste heat, and further increase the output power and improve component reliability.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A light emitting diode structure, comprising:
a substrate;
a first semiconductor layer, disposed on the substrate, and the first semiconductor layer comprising:
a first thickness structure; and
a second thickness structure, wherein a first thickness of the first thickness structure is substantially thicker than a second thickness of the second thickness structure;
a light emitting layer, disposed on the first thickness structure of the first semiconductor layer;
a second semiconductor layer, disposed on the light emitting layer, wherein a doping type of the second semiconductor layer is different from a doping type of the first semiconductor layer;
a plurality of semiconductor contacting layers, disposed on the second thickness structure of the first semiconductor layer, wherein vertical projections of the plurality of semiconductor contacting layers and the light emitting layer on the substrate don't overlap nor contact, and a doping type of the plurality of semiconductor contacting layers is the same as the doping type of the first semiconductor layer;
a first conductive layer, disposed on the plurality of semiconductor contacting layers; and
a second conductive layer, disposed on the second semiconductor layer.

2. The light emitting diode structure of claim 1, further comprising:
an insulating layer, covering a sidewall of the first thickness structure, an upper surface of the second thickness structure, a sidewall of the light emitting layer, a sidewall of the second semiconductor layer, sidewalls and upper surfaces of the plurality of semiconductor contacting layers, a sidewall of the first conductive layer, and a sidewall and an upper surface of the second conductive layer, wherein the insulating layer has a first opening and a second opening, respectively disposed on the first conductive layer and the second conductive layer; and
a first conductive pad and a second conductive pad, both disposed on the insulating layer, and respectively electrically connected to the first conductive layer and the second conductive layer through the first opening and the second opening.

3. The light emitting diode structure of claim 1, wherein one of the plurality of semiconductor contacting layers comprises $Al_xGa_yIn_{1-x-y}N$, and $0 \le x, y \le 1$.

4. The light emitting diode structure of claim 3, wherein, when x+y=1, a doping concentration of the one of the plurality of semiconductor contacting layers is higher than $1\times10^{19}/cm^3$.

5. The light emitting diode structure of claim 1, wherein a thickness of one of the plurality of semiconductor contacting layers is from 1 nm to 500 nm.

6. The light emitting diode structure of claim 1, wherein a doping concentration of one of the plurality of semiconductor contacting layers is higher than a doping concentration of the first semiconductor layer.

7. The light emitting diode structure of claim 1, wherein of the plurality of semiconductor contacting layers comprises a plurality of sub-contacting layers, a doping concentration of each of the plurality of sub-contacting layers is the same or different.

8. The light emitting diode structure of claim 1, wherein of the plurality of semiconductor contacting layers comprises a plurality of sub-contacting layers, the plurality of sub-contacting layers comprises $Al_xGa_yIn_{1-x-y}N$, and $0\leq x$, $y\leq 1$, wherein, when each of the plurality of sub-contacting layers has x+y=1, a doping concentration of the sub-contacting layer adjacent to the first conductive layer is higher than doping concentrations of the other sub-contacting layers.

9. The light emitting diode structure of claim 1, wherein of the plurality of semiconductor contacting layers comprises a plurality of sub-contacting layers, and the plurality of sub-contacting layers comprises $Al_xGa_yIn_{1-x-y}N$, and $0\leq x$, $y\leq 1$, wherein, one of the plurality of sub-contacting layers adjacent to the first conductive layer is $Ga_yIn_{1-y}N$, and $0<y<1$.

10. The light emitting diode structure of claim 1, wherein one of the plurality of semiconductor contacting layers comprises a plurality of sub-contacting layers, and each of the plurality of sub-contacting layers is different in energy gap.

11. The light emitting diode structure of claim 1, wherein the plurality of the semiconductor contacting layers is separated from each other.

12. The light emitting diode structure of claim 10, wherein a part of the light emitting layer is disposed between any two of the plurality of semiconductor contacting layers.

13. The light emitting diode structure of claim 12, wherein an amount of the first conductive layer is plurality, and each of the plurality of first conductive layers is disposed on respective one of the plurality of semiconductor contacting layers.

14. The light emitting diode structure of claim 13, further comprising a conductive connecting layer, disposed on the plurality of the first conductive layers, and configured to electrically connecting to each of the plurality of the first conductive layers.

15. The light emitting diode structure of claim 1, wherein one of the plurality of semiconductor contacting layers comprises a plurality of through holes, the plurality of through holes penetrates the one of the plurality of semiconductor contacting layers along a thickness direction.

16. A light emitting diode structure, comprising:
a substrate;
a second conductive layer, disposed on the substrate;
a second semiconductor layer, disposed on the second conductive layer;
a light emitting layer, disposed on the second semiconductor layer;
a first semiconductor layer, disposed on the light emitting layer, wherein a doping type of the first semiconductor layer is different from a doping type of the second semiconductor layer;
a first conductive layer, disposed between the substrate and the second conductive layer, wherein the first conductive layer comprises a base part and a protruding part, and the protruding part penetrates the second conductive layer, the second semiconductor layer and the light emitting layer to electrically connects with the first semiconductor layer;
an insulating layer, disposed between the first conductive layer and the second conductive layer; and
a semiconductor contacting layer, disposed between the protruding part of the first conductive layer and the first semiconductor layer, wherein a doping type of the semiconductor contacting layer is the same as the doping type of the first semiconductor layer;
wherein the protruding part of the first conductive layer and the semiconductor contacting layer are both electrically isolated from the second conductive layer, the second semiconductor layer and the light emitting layer by an extending part of the insulating layer.

17. The light emitting diode structure of claim 16, wherein a doping concentration of the semiconductor contacting layer is higher than a doping concentration of the first semiconductor layer.

18. The light emitting diode structure of claim 16, wherein the semiconductor contacting layer comprises a plurality of sub-contacting layers, a doping concentration of each of the plurality of sub-contacting layers is the same or different.

19. The light emitting diode structure of claim 16, further comprising an insulating part, wherein the semiconductor contacting layer comprises a plurality of contacting layers, the plurality of contacting layers is all electrically connected to the first semiconductor layer and the first conductive layer, and two adjacent ones of the plurality of contacting layers are separated from each other by the insulating part.

20. The light emitting diode structure of claim 16, wherein the semiconductor contacting layer comprises a plurality of through holes, the plurality of through holes penetrates the semiconductor contacting layer along a thickness direction.

* * * * *